US008628616B2

(12) United States Patent
Takasuka et al.

(10) Patent No.: US 8,628,616 B2
(45) Date of Patent: Jan. 14, 2014

(54) VAPOR-PHASE PROCESS APPARATUS, VAPOR-PHASE PROCESS METHOD, AND SUBSTRATE

(75) Inventors: Eiryo Takasuka, Itami (JP); Toshio Ueda, Itami (JP); Toshiyuki Kuramoto, Itami (JP); Masaki Ueno, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 1081 days.

(21) Appl. No.: 12/330,904

(22) Filed: Dec. 9, 2008

(65) Prior Publication Data

US 2009/0148704 A1 Jun. 11, 2009

(30) Foreign Application Priority Data

| Dec. 11, 2007 | (JP) | 2007-319735 |
| Dec. 18, 2007 | (JP) | 2007-326001 |
| Aug. 29, 2008 | (JP) | 2008-221600 |
| Sep. 10, 2008 | (JP) | 2008-232493 |

(51) Int. Cl.
*C23C 16/455* (2006.01)
*C23C 16/00* (2006.01)
*H01L 21/306* (2006.01)

(52) U.S. Cl.
USPC ..................... 118/715; 156/345.33

(58) Field of Classification Search
USPC .................. 118/715; 156/345.33, 345.34
See application file for complete search history.

(56) References Cited

U.S. PATENT DOCUMENTS

| 3,750,620 A | * | 8/1973 | Eversteijn et al. ........... 118/725 |
| 4,369,031 A | * | 1/1983 | Goldman et al. ............ 432/198 |
| 4,533,410 A | * | 8/1985 | Ogura et al. .................... 117/99 |
| 4,651,673 A | * | 3/1987 | Muething ...................... 118/725 |
| 4,780,174 A | * | 10/1988 | Lan et al. ....................... 117/101 |
| 4,800,105 A | | 1/1989 | Nakayama et al. |
| 4,849,260 A | | 7/1989 | Kusumoto et al. |
| 4,924,807 A | | 5/1990 | Nakayama et al. |

(Continued)

FOREIGN PATENT DOCUMENTS

| JP | 05-175135 | 7/1993 |
| JP | 06-77196 | 3/1994 |

(Continued)

OTHER PUBLICATIONS

Machine Translation of JP 2005-005594.*

(Continued)

*Primary Examiner* — Jeffrie R Lund
(74) *Attorney, Agent, or Firm* — Drinker Biddle & Reath LLP

(57) ABSTRACT

A vapor-phase process apparatus and a vapor-phase process method capable of satisfactorily maintaining quality of processes even when different types of processes are performed are obtained. A vapor-phase process apparatus includes a process chamber, gas supply ports serving as a plurality of gas introduction portions, and a gas supply portion (a gas supply member, a pipe, a flow rate control device, a pipe, and a buffer chamber). The process chamber allows flow of a reaction gas therein. The plurality of gas supply ports are formed in a wall surface (upper wall) of the process chamber along a direction of flow of the reaction gas. The gas supply portion can supply a gas into the process chamber at a different flow rate from each of one gas supply port and another gas supply port different from that one gas supply port among the plurality of gas supply ports.

8 Claims, 15 Drawing Sheets

(56) References Cited

U.S. PATENT DOCUMENTS

| | | | |
|---|---|---|---|
| 4,994,301 A | 2/1991 | Kusumoto et al. | |
| 5,244,501 A | 9/1993 | Nakayama et al. | |
| 5,334,277 A | 8/1994 | Nakamura | |
| 5,433,169 A | 7/1995 | Nakamura | |
| 5,453,124 A * | 9/1995 | Moslehi et al. | 118/715 |
| 5,871,586 A | 2/1999 | Crawley et al. | |
| 6,022,412 A * | 2/2000 | Vincenzo et al. | 118/715 |
| 6,093,253 A * | 7/2000 | Lofgren et al. | 118/725 |
| 6,190,457 B1 * | 2/2001 | Arai et al. | 438/478 |
| 6,190,459 B1 * | 2/2001 | Takeshita et al. | 118/715 |
| 6,214,116 B1 * | 4/2001 | Shin | 118/640 |
| 6,291,800 B1 | 9/2001 | Shirakawa et al. | |
| 6,294,026 B1 * | 9/2001 | Roithner et al. | 118/715 |
| 6,380,518 B2 | 4/2002 | Shirakawa et al. | |
| 6,508,913 B2 * | 1/2003 | McMillin et al. | 156/345.29 |
| 6,592,674 B2 | 7/2003 | Sakai et al. | |
| 6,666,921 B2 * | 12/2003 | Sakai et al. | 118/715 |
| 6,820,570 B2 * | 11/2004 | Kilpela et al. | 118/723 R |
| 6,902,622 B2 | 6/2005 | Johnsgard et al. | |
| 6,933,010 B2 | 8/2005 | Yamada et al. | |
| 7,481,886 B2 * | 1/2009 | Kato et al. | 118/715 |
| 7,709,398 B2 | 5/2010 | Strauch et al. | |
| 8,349,083 B2 * | 1/2013 | Takasuka et al. | 118/715 |
| 8,349,403 B2 * | 1/2013 | Takasuka et al. | 427/248.1 |
| 2002/0160112 A1 * | 10/2002 | Sakai et al. | 427/255.28 |
| 2003/0075273 A1 * | 4/2003 | Kilpela et al. | 156/345.33 |
| 2006/0121193 A1 | 6/2006 | Strauch et al. | |
| 2008/0241387 A1 * | 10/2008 | Keto | 427/255.394 |
| 2009/0148704 A1 * | 6/2009 | Takasuka et al. | 428/411.1 |
| 2012/0024227 A1 | 2/2012 | Takasuka et al. | |
| 2013/0108788 A1 * | 5/2013 | Takasuka et al. | 427/248.1 |

FOREIGN PATENT DOCUMENTS

| | | |
|---|---|---|
| JP | 07-22341 | 1/1995 |
| JP | 2000-195807 | 7/2000 |
| JP | 2000-277442 | 10/2000 |
| JP | 2001-284269 | 10/2001 |
| JP | 2002-371361 | 12/2002 |
| JP | 2005-005594 | 1/2005 |
| JP | 2006-013326 | 1/2006 |

OTHER PUBLICATIONS

Derwent abstract for JP 2005-005594.*

* cited by examiner

VAPOR-PHASE PROCESS APPARATUS, VAPOR-PHASE PROCESS METHOD, AND SUBSTRATE

BACKGROUND OF THE INVENTION

1. Field of the Invention

The present invention relates to a vapor-phase process apparatus, a vapor-phase process method, and a substrate, and more particularly to a vapor-phase process apparatus, a vapor-phase process method, and a substrate capable of achieving high-quality process.

2. Description of the Background Art

A vapor-phase process apparatus for such a process as formation of a film on a surface of an object to be processed (hereinafter referred to as a "process object") such as a substrate has conventionally been known (see, for example, Japanese Patent Laying-Open Nos. 2005-005594, 2002-371361 and 2006-013326). In the vapor-phase process apparatus disclosed, for example, in FIG. 1 of Japanese Patent Laying-Open No. 2005-005594, a plurality of flow-guide gas blowing portions are formed in positions (in an upper wall of a process chamber) opposed to the process object (substrate) arranged in a process chamber (a chamber). Then, the flow-guide gas is supplied into the process chamber from the flow-guide gas blowing portions so that contamination due to a by-product of a reaction gas (raw material gas) on a wall surface of the process chamber can be prevented and a rate of film deposition on a substrate surface and uniformity of a composition of a formed film can be maintained.

In addition, according to Japanese Patent Laying-Open No. 2002-371361, in order to efficiently vapor-deposit a film on a surface of a substrate serving as a process object, a pressing gas for pressing a raw material gas against the surface of the substrate is supplied from a process chamber wall portion (an upper wall) opposed to the substrate. In a pressing gas supply portion, a device like a nozzle is used in order to adjust a direction of supply of the pressing gas to an obliquely downward direction or to a horizontal direction. Moreover, according to Japanese Patent Laying-Open No. 2006-013326 as well, a flow-guide gas corresponding to the pressing gas described above is supplied through an upper wall of a process chamber into the process chamber. Further, a nozzle is used in order to adjust a direction of supply of the flow-guide gas to an obliquely downward direction.

The conventional vapor-phase process apparatus described above, however, has suffered from the following problems. Specifically, a structure of the upper wall of the process chamber in which the flow-guide gas blowing portions are provided has a predetermined, certain shape. In addition, in the apparatus shown in FIG. 1 of Japanese Patent Laying-Open No. 2005-005594, the flow-guide gas is supplied from a common gas supply source to the plurality of flow-guide gas blowing portions and a flow rate or the like cannot be controlled individually for each flow-guide gas blowing portion. Here, if types of processes for the surface of the process object are different (for example, materials for a film to be deposited in a film deposition process are different), conditions for film deposition are also different, and hence optimal conditions for a flow rate or distribution of the flow-guide gas supplied from the flow-guide gas blowing portions are also different. In the conventional vapor-phase process apparatus described above, however, if types of such processes are changed, it is difficult to optimize a flow rate or flow velocity distribution of the flow-guide gas depending on types of processes. Accordingly, it has been difficult to satisfactorily maintain process quality (for example, quality of a formed film), such as a rate of film deposition on the substrate surface and uniformity of a composition of a formed film.

Further, according to Japanese Patent Laying-Open Nos. 2002-371361 and 2006-013326, a plurality of nozzles supply the pressing gas (the flow-guide gas), however, these gases may not form such a gas layer as uniformly covering a wall portion (an upper wall) of the process chamber. Unless such a gas layer is formed, a part of the raw material gas reaches the upper wall and deposits originating from the raw material gas may adhere to the upper wall. When such deposits peel off from the upper wall (the wall portion) and result in deposit pieces, the deposit pieces may adhere to the surface of the process object, which results in large number of defects.

The present invention was made to solve the above-described problems, and an object of the present invention is to provide a vapor-phase process apparatus and a vapor-phase process method capable of satisfactorily maintaining quality of processes even when different types of processes are performed.

In addition, another object of the present invention is to provide a vapor-phase process apparatus and a vapor-phase process method capable of performing a process less likely to cause defects on a processed surface.

Moreover, yet another object of the present invention is to provide a high-quality substrate subjected to a process excellent in uniformity or the like with the use of the vapor-phase process method above.

SUMMARY OF THE INVENTION

A vapor-phase process apparatus according to the present invention includes a process chamber, a plurality of gas introduction portions, and a gas supply portion. The process chamber allows flow of a reaction gas therein. The plurality of gas introduction portions are formed in a wall surface of the process chamber along a direction of flow of the reaction gas. The gas supply portion can supply a gas into the process chamber at a different flow rate from each of one gas introduction portion and another gas introduction portion different from that one gas introduction portion among the plurality of gas introduction portions.

An amount of supply of the gas from the plurality of gas introduction portions can thus locally be changed by means of the gas supply portion, so that a state of supply of the gas supplied from the gas introduction portions to the process chamber depending on a type or the like of a process (more specifically, a gas flow state in the process chamber) can arbitrarily be changed. Therefore, by optimizing the flow rate of supply of the gas supplied from the gas introduction portions depending on a type of a process, process quality such as uniformity of a process can be improved.

A vapor-phase process apparatus according to the present invention includes a process chamber in which a reaction gas flows, gas introduction portions, and a flow-guide plate. A plurality of gas introduction portions are formed in a wall portion of the process chamber along a direction of flow of the reaction gas. The flow-guide plate is formed to cover the gas introduction portion in the process chamber. The flow-guide plate guides a gas supplied from the gas introduction portion into the process chamber such that the gas flows in a direction along the direction of flow of the reaction gas. The flow-guide plate is formed in the wall portion of the process chamber where the gas introduction portions are formed, to extend in a direction of reactor width intersecting the direction of flow of the reaction gas.

Thus, the gas guided by the flow-guide plate (such as the gas blown from between the surface of the wall portion (wall surface) where the gas introduction portions are formed and the flow-guide plate) forms a gas layer on the surface of the wall portion of the process chamber. This gas layer lowers the possibility that the reaction gas reaches the surface of the wall portion of the process chamber (such as the surface of the wall portion opposed to the process object). Consequently, an amount of deposits due to reaction of the reaction gas on the surface of the wall portion can be reduced. Accordingly, foreign substances formed as a result of peel-off of deposits on the surface of the wall portion can be reduced. This foreign substances float in the process chamber and adhere to the surface of the process objects. Therefore, lower process quality due to adhesion of such foreign substances can be suppressed.

In addition, as the flow-guide plate extending in the direction perpendicular to the flow is employed, a uniform gas layer can be formed without extremely increasing the number of gas introduction portions. Moreover, formation of a uniformly flowing gas layer as described above on the surface of the wall portion brings about a noticeable effect of increase in flow velocity of the reaction gas in a downstream portion in the flow direction. Accordingly, a process rate in the downstream portion (for example, in the case of a film deposition process, a film growth rate) can be increased. Here, in achieving a uniform process on the substrate representing an exemplary process object (for example, in the case of a film deposition process, achieving a uniform film thickness) by rotating a substrate support base (a susceptor), the process cannot sufficiently be uniform only by rotating the susceptor if increase in the process rate (such as a film growth rate) in the downstream portion is not high enough. By using the vapor-phase process apparatus according to the present invention, however, the process rate in the downstream portion can be increased and uniformity of a process on the substrate (such as uniformity of a thickness or quality of the formed film) can be realized.

A vapor-phase process method according to the present invention includes the steps of setting a process object in a process chamber, and processing the process object by supplying a reaction gas into the process chamber. In the processing step, a gas is supplied from each of gas introduction portions among a plurality of gas introduction portions formed in a wall surface of the process chamber along a direction of flow of the reaction gas. A flow rate of the gas from each introduction portion can be different from those from other introduction portion.

In this way, as compared with an example where the gas is supplied into the process chamber at the same flow rate from all gas introduction portions, the gas supply state (more specifically, a flow state of the gas in the process chamber) can be changed depending on a process. Accordingly, by optimizing the gas supply state depending on a type of a process, process quality such as uniformity of a process rate can be improved.

A vapor-phase process method according to the present invention includes the steps of setting a process object in a process chamber, and processing the process object by supplying a reaction gas into the process chamber. In the processing step, a gas supplied to the process chamber separately along a surface of a wall portion opposed to the process object, in addition to the reaction gas. Flow velocity distribution of the gas in a direction of width intersecting a direction of flow of the reaction gas is uniform.

Here, uniform flow velocity distribution of the gas means that variation in flow velocity of the gas in the direction of reactor width is within a 10% range from average flow velocity in the direction of width. Specifically, flow velocity is measured at five measurement points in the direction of reactor width and an average value of resultant data is calculated. If a percentage of a value obtained by dividing the absolute value of the difference between the obtained average value and each piece of data by the average value is not higher than 10%, regarded as uniform flow velocity distribution is established.

Thus, the gas that flows along the surface of the wall portion forms a gas layer on the surface of the wall portion. This gas layer reduces the amount of the reaction gas reaching the surface of the wall portion of the process chamber (such as the surface of the wall portion opposed to the process object). Consequently, in the processing step, an amount of deposits on the surface of the wall portion can be reduced. Accordingly, the amount of foreign substances such as deposit frakes from the surface of the wall, which adhere to the surface of the process object, can be lowered. Therefore, lower process quality due to adhesion of such foreign substances can be suppressed.

In addition, formation of a uniformly flowing gas layer as described above on the surface of the wall portion brings about a noticeable effect of increase in flow velocity of the reaction gas in a downstream of the direction of the reaction gas flow. Accordingly, a process rate in the downstream (for example, in the case of a film deposition process, a film growth rate) can be increased. Therefore, when a susceptor rotation or the like is employed as well, uniformity of a process on the substrate (such as uniformity of a thickness or quality of the formed film) can be ensured.

A substrate according to the present invention is a substrate manufactured with the vapor-phase process method above. As the substrate is thus subjected to a uniform process, an excellent substrate surface layer (for example, a film formed on the surface of the substrate) can be obtained.

As described above, according to the present invention, process quality such as process uniformity can be improved, and consequently a substrate of excellent quality can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
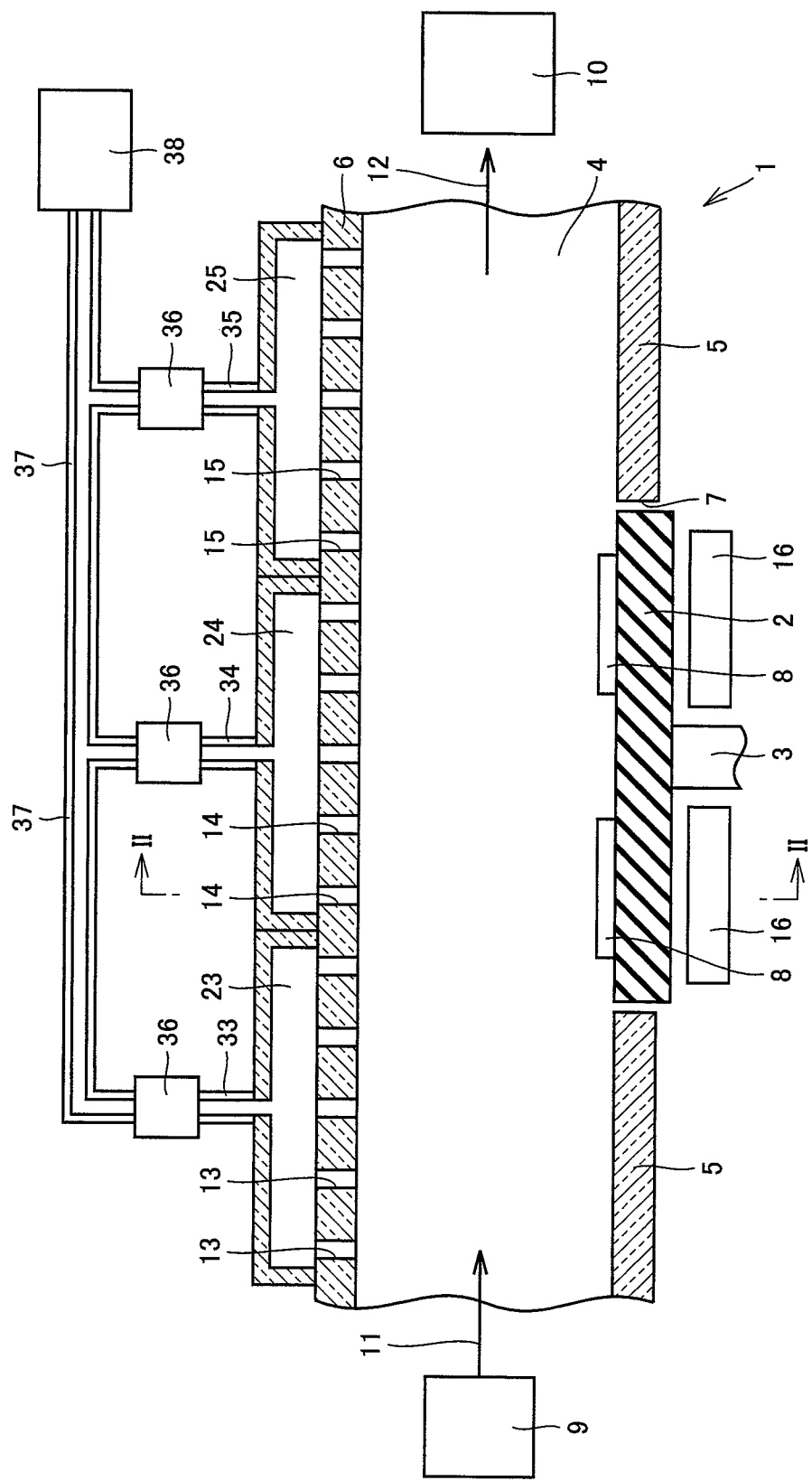
FIG. 1 is a schematic cross-sectional view showing Embodiment 1 of a vapor-phase process apparatus according to the present invention.

An embodiment of the present invention will be described hereinafter with reference to the drawings. In the drawings below, the same or corresponding elements have the same reference characters allotted, and detailed description thereof will not be repeated.

Embodiment 1

Embodiment 1 of a vapor-phase process apparatus according to the present invention will be described with reference to FIGS. 1 and 2.

Figure 2:
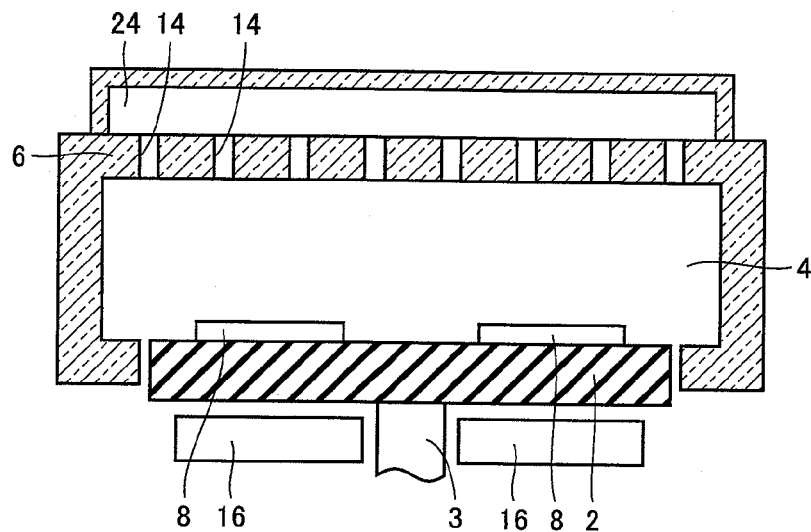
FIG. 2 is a schematic cross-sectional view along the line II-II in FIG. 1.

As shown in FIGS. 1 and 2, a vapor-phase process apparatus 1 is a vapor-deposition apparatus, and it includes a process chamber 4, a susceptor 2 located in an opening 7 formed in a bottom wall 5 of process chamber 4, a reaction gas supply member 9, a gas exhaust member 10, a heater 16, and a gas supply portion for supplying a purge gas into process chamber 4. This gas supply portion is specifically constituted of a gas supply member 38, a pipe 37 connected to gas supply member 38, a flow rate control device 36 connected to pipe 37, and buffer chambers 23 to 25 supplied with a gas (a purge gas) from flow rate control device 36 through pipes 33 to 35. In order to supply the gas from these buffer chambers 23 to 25 into process chamber 4, gas supply ports 13 to 15 serving as a plurality of gas introduction portions are formed in an upper wall 6 of the process chamber.

Process chamber 4 has a rectangular cross-section, and annular opening 7 is formed in bottom wall 5. Susceptor 2 is arranged in this opening 7. Susceptor 2 has a disk shape. Susceptor 2 carries a substrate 8, which is a process object, on its upper surface. In addition, a rotation shaft 3 is connected to a central portion of a back side (a surface opposite to the surface carrying substrate 8) of susceptor 2. Susceptor 2 is rotatable around rotation shaft 3. Rotation shaft 3 is connected to a not-shown rotational drive source such as a motor.

Reaction gas supply member 9 supplies a reaction gas (a raw material gas) or an atmospheric gas for a film deposition process or the like into process chamber 4. In an example where vapor-phase process apparatus 1 performs a process other than the film deposition process (such as an etching process), a gas used for that process is supplied from reaction gas supply member 9 into process chamber 4. In addition, gas exhaust member 10 exhausts from process chamber 4, the gas after reaction such as a film deposition process ends.

In upper wall 6 of process chamber 4, a plurality of gas supply ports 13 to 15 aligned at prescribed intervals in a direction along a direction of flow of the reaction gas shown with arrows 11 and 12 and in a direction intersecting the direction of flow of the reaction gas (specifically, a direction of width of process chamber 4, which is a direction perpendicular to the direction of flow of the reaction gas) are formed. From a different point of view, gas supply ports 13 to 15 are arranged in matrix in upper wall 6 of process chamber 4. A flow-guide plate 70 (see FIG. 10) which will be described later may be arranged in gas supply ports 13 to 15.

Buffer chamber 23 is formed in a portion above a plurality of gas supply ports 13 on a most upstream side in the direction of flow of the reaction gas, among these gas supply ports 13 to 15. In addition, second buffer chamber 24 is formed above a plurality of gas supply ports 14 on the side downstream of gas supply ports 13 in the direction of flow of the reaction gas. Then, third buffer chamber 25 is formed above a plurality of gas supply ports 15 in downstream of gas supply ports 14 in the direction of flow of the reaction gas. Each of buffer chambers 23 to 25 has a width substantially equal to a length of process chamber 4 in a direction of width, as shown in FIG. 2. Accordingly, gas supply ports 14 aligned in the direction of width of process chamber 4 (the direction intersecting the direction of flow of the reaction gas) are all connected to the same buffer chamber 24. Regarding other gas supply ports 13 and 15 as well, (adjacent) gas supply ports 13 and 15 aligned in the direction of width are also connected to the same buffer chambers 23 and 25, respectively. These buffer chambers 23 to 25 are connected to flow rate control devices 36 through pipes 33 to 35 respectively, as described above. Flow rate control device 36 is connected to gas supply member 38 through pipe 37.

Gas supply member 38 is a supply source of a purge gas, which is supplied into process chamber 4 from upper wall 6 side through pipe 37, flow rate control device 36, pipes 33 to 35, buffer chambers 23 to 25, and gas supply ports 13 to 15. Any gas may be used as the purge gas, and for example, a nitrogen gas or a hydrogen gas may be used. In addition, gas supply member 38 may supply a single type of gas as the purge gas, however, gas supply member 38 may supply as the purge gas, a gas mixture in which two or more types of gases are mixed.

Here, this flow rate control device 36 connected to each of buffer chamber 23 to 25 can independently control a flow rate of the gas supplied to buffer chambers 23 to 25. Therefore, flow rate of the gas introduced into process chamber 4 can independently be controlled for each group of gas supply ports 13 to 15 connected to respective buffer chambers 23 to 25.

By performing a film deposition process as an exemplary process which will be described later with the use of vapor-phase process apparatus 1 structured as such, the flow rate of the purge gas from gas supply ports 13 to 15 can be changed for each area (for each region corresponding to buffer chambers 23 to 25), depending on a film deposition condition such as a material for a film to be deposited. Accordingly, a flow condition for supplying the purge gas can be optimized to achieve a uniform film deposition rate or quality of the film formed on substrate 8. Specifically, by appropriately supplying the purge gas, such a state that the reaction gas (the source gas) used for the film deposition process on substrate 8 is pressed toward substrate 8 side from upper wall 6 side and a greater amount of the reaction gas is present more uniformly in the vicinity of substrate 8 can be established. Consequently, the deposition rate of the film formed on the surface of substrate 8 can be improved, or uniformity of the film deposition rate or uniformity of quality of the formed film can be improved. In addition, even though the film to be formed in the film deposition process is changed and a film deposition condition is changed, uniformity of quality of the formed film can satisfactorily be maintained by adjusting as appropriate a condition for supplying the purge gas (a supply flow rate or flow rate distribution of the purge gas) from gas supply ports 13 to 15.

In addition, by supplying the purge gas from gas supply ports 13 to 15 in upper wall 6 into process chamber 4, formation of deposits on upper wall 6 or the like can be suppressed.

Moreover, as uniformity of a film deposition condition can be ensured to a certain extent, a film excellent in uniformity can be formed also by using susceptor 2 that performs single rotating motion, without using a susceptor having a complicated mechanism such as a rotary and revolutionary susceptor. A rotary and revolutionary susceptor may be used as the susceptor in vapor-phase process apparatus 1 according to the present invention, however, from a point of view of a simplified apparatus structure, a simple susceptor shown in FIG. 1 and the like is preferably used.

A first variation of the vapor-phase process apparatus shown in FIGS. 1 and 2 will be described with reference to FIG. 3. It is noted that FIG. 3 corresponds to FIG. 2.

Figure 3:
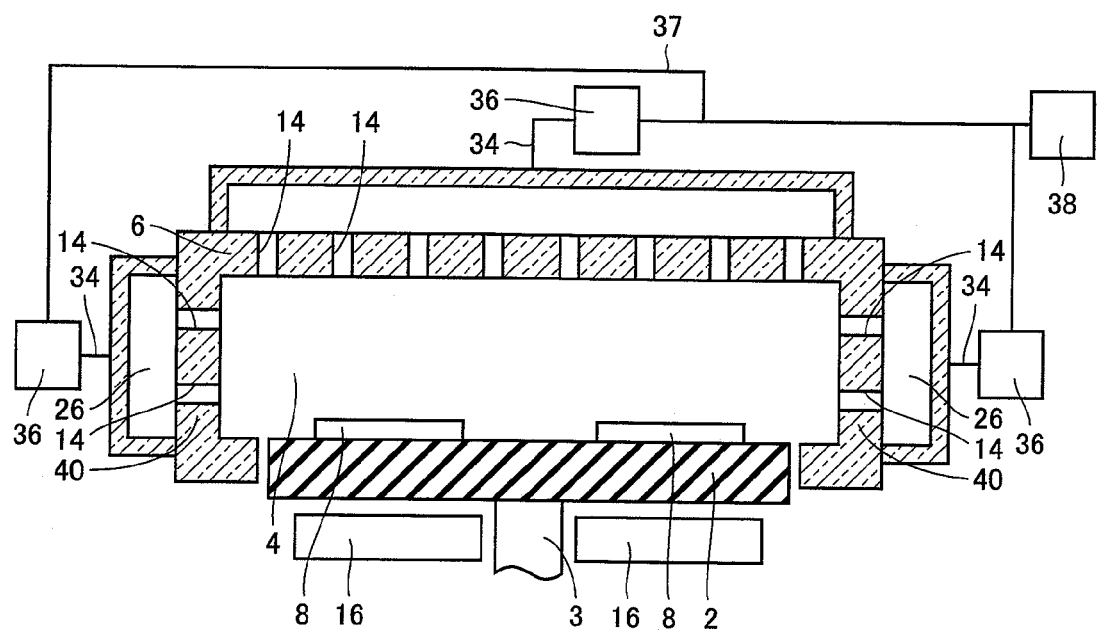
FIG. 3 is a schematic cross-sectional view showing a first variation of the vapor-phase process apparatus shown in FIGS. 1 and 2.

As shown in FIG. 3, the first variation of vapor-phase process apparatus 1 has a structure basically the same as that of vapor-phase process apparatus 1 shown in FIGS. 1 and 2, however, it is different in that gas supply ports 14 are formed not only in upper wall 6 of process chamber 4 but also in a sidewall 40. Specifically, as shown in FIG. 3, one gas supply port 14 or a plurality of gas supply ports 14 is/are formed also in sidewall 40 of process chamber 4. Then, a buffer chamber 26 is formed on sidewall 40 (adjacent to process chamber 4), to communicate with gas supply port(s) 14 formed in sidewall 40. Buffer chamber 26 is connected to flow rate control device 36 through a pipe 34. Each flow rate control device 36 is connected to gas supply member 38 through pipe 37.

Such vapor-phase process apparatus 1 can also achieve an effect the same as in vapor-phase process apparatus 1 shown in FIGS. 1 and 2.

A second variation of Embodiment 1 of the vapor-phase process apparatus according to the present invention will be described with reference to FIG. 4. It is noted that FIG. 4 corresponds to FIG. 2.

Figure 4:
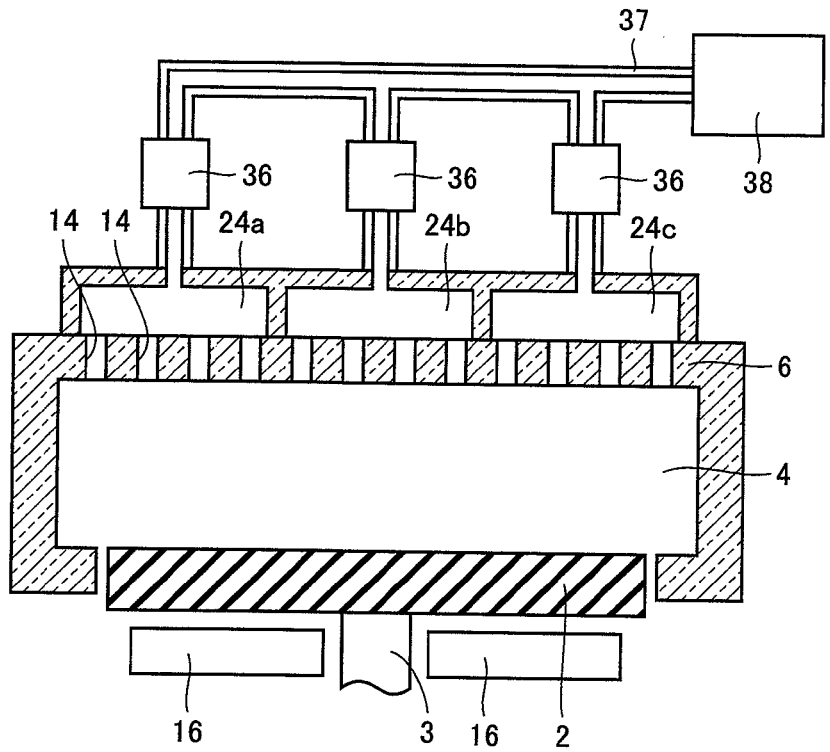
FIG. 4 is a schematic cross-sectional view showing a second variation of the vapor-phase process apparatus shown in FIGS. 1 and 2.

Vapor-phase process apparatus 1 shown in FIG. 4 has a structure basically the same as that of the vapor-phase process apparatus shown in FIGS. 1 and 2, however, it is different in that a flow rate of the purge gas supplied from a plurality of gas supply ports 14 into process chamber 4 can be controlled individually or for each group of gas supply ports, in a direction intersecting the direction of flow of the reaction gas (the direction shown with arrow 11 or arrow 12 in FIG. 1) (a perpendicular direction, namely, in the direction of width of process chamber 4). Specifically, a plurality of gas supply ports 14 aligned in upper wall 6 of process chamber 4 in the direction intersecting a direction of supply of the reaction gas are divided into three groups in the direction intersecting the direction of supply of the reaction gas, and buffer chambers 24a to 24c corresponding to respective groups are formed. Specifically, buffer chamber 24a is formed above a group of gas supply ports 14 located on the left side when viewed from the reaction gas upstream (the direction of the source gas supply). Then, buffer chamber 24b is formed above a plurality of gas supply ports 14 located in a substantially central portion when viewed from the reaction gas upstream. Further, buffer chamber 24c is formed above a plurality of gas supply ports 14 on the right side when viewed from the reaction gas upstream. Each of buffer chambers 24a to 24c is connected individually to flow rate control device 36. Each flow rate control device 36 is connected to gas supply member 38 through pipe 37. Accordingly, by controlling a flow rate of the purge gas supplied to each of buffer chambers 24a to 24c with flow rate control device 36, the flow rate of the purge gas supplied from gas supply ports 14 into process chamber 4 can readily be changed in the direction intersecting (the direction of width) the direction of flow of the reaction gas.

In vapor-phase process apparatus 1 shown in FIG. 4, regarding gas supply ports 13 and 15 as well, a plurality of buffer chambers are arranged in the direction of width as shown in FIG. 4. More specifically, buffer chambers are arranged in matrix on upper wall 6 of process chamber 4. For example, nine buffer chambers in total may be arranged in matrix of 3×3 on upper wall 6 of process chamber 4.

Thus, by controlling an amount of supply of the purge gas in both of the direction of flow of the reaction gas and the direction of reactor width, a condition for film deposition on substrate 8 can more accurately be controlled.

A vapor-deposition method representing a method of manufacturing the substrate using the vapor-phase process apparatus shown in FIGS. 1 and 2 will now be described.

Figure 5:
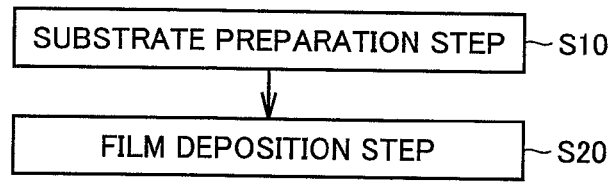
FIG. 5 is a flowchart for illustrating a vapor-phase process method with the use of the vapor-phase process apparatus shown in FIGS. 1 and 2.

As shown in FIG. 5, the vapor-phase process method is a vapor-deposition method, and initially, a substrate preparation step (S10) is performed. Specifically, substrate 8 which is a process object is mounted on susceptor 2 of vapor-phase process apparatus 1.

Then, a film deposition step (S20) is performed. Specifically, process chamber 4 is adjusted to a prescribed pressure by using gas exhaust member 10, and thereafter, the reaction gas is supplied into process chamber 4 from reaction gas supply member 9 as shown with arrow 11 (see FIG. 1). Here, susceptor 2 and substrate 8 are heated in advance by heater 16, to heat substrate 8 to a prescribed process temperature. Then, when the reaction gas (source gas) supplied from reaction gas supply member 9 reaches substrate 8, the reaction gas decomposes and a prescribed film is formed on substrate 8 heated by heater 16.

Here, the purge gas is supplied from a plurality of gas supply ports 13 to 15 formed in upper wall 6 of process chamber 4 into process chamber 4. In addition, flow rate control devices 36 shown in FIG. 1 are individually controlled so that the flow rate of the purge gas supplied from gas supply ports 13 located on the reaction gas upstream and the flow rate of the purge gas supplied from gas supply ports 15 located on the reaction gas downstream are controlled at least to be different from each other. More preferably, control is carried out such that the amount of supply (flow rate) of the purge gas from gas supply ports 15 in the downstream is greater than the amount of supply of the reaction gas from gas supply ports 13 in the upstream. Consequently, the reaction gas supplied from reaction gas supply member 9 as shown with arrow 11 (see FIG. 1) is pressed toward substrate 8 by the purge gas in the downstream in process chamber 4 and a film deposition process by using the reaction gas is further promoted. Therefore, the growth rate of the film on substrate 8 can be improved and a uniform film excellent in film quality can be formed.

Figure 6:
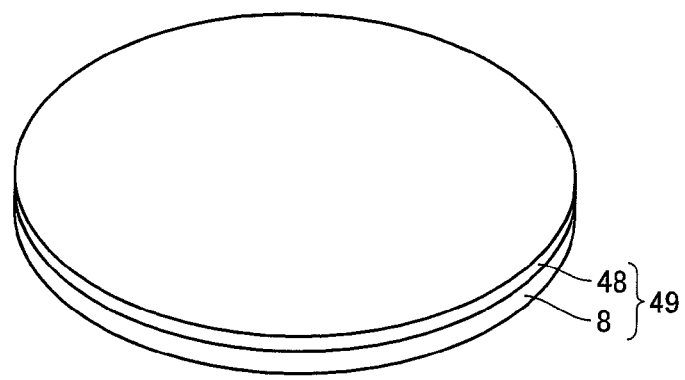
FIG. 6 is a schematic perspective view for illustrating an epitaxial-layer-including substrate obtained with the vapor-deposition method according to the present invention.

A substrate provided with an epitaxial layer (hereinafter referred to as an "epitaxial-layer-including substrate") obtained with the manufacturing method described above is an epitaxial-layer-including substrate 49 in which an epitaxial layer 48 is formed on substrate 8, as shown in FIG. 6. This epitaxial-layer-including substrate 49 is excellent in film quality of formed epitaxial layer 48. Specifically, such an extremely consistent epitaxial layer 48 that an index indicating film thickness uniformity (standard deviation/average value of thickness) is not higher than 1% is obtained. It is noted that data of a thickness of epitaxial layer 48 for calculating the index described above can be obtained, for example, by optical interferometry or an X-ray diffraction method. Specifically, a thickness of epitaxial layer 48 is measured at 1 mm pitch with optical interferometry over the entire substrate surface on which epitaxial layer 48 has been formed, and the average value and standard deviation of the thickness is calculated from the measurement data of the entire surface of the substrate. Then, the value of the index above can be calculated from the data of the obtained average value and standard deviation.

In vapor-phase process apparatus 1 described above, gas supply ports 13 to 15 can have an annular or rectangular cross-sectional shape. The cross-sectional shape of gas supply ports 13 to 15 is not limited as such, and other shapes may be adopted. For example, gas supply ports 13 to 15 may be implemented as an opening like a slit that extends in the direction of width of process chamber 4 (the direction intersecting the direction of flow of the reaction gas, more preferably a direction orthogonal thereto). Here, the purge gas can be supplied more uniformly in the direction of width of process chamber 4.

Embodiment 2

Embodiment 2 of the vapor-phase process apparatus according to the present invention will be described with reference to FIG. 7.

Figure 7:
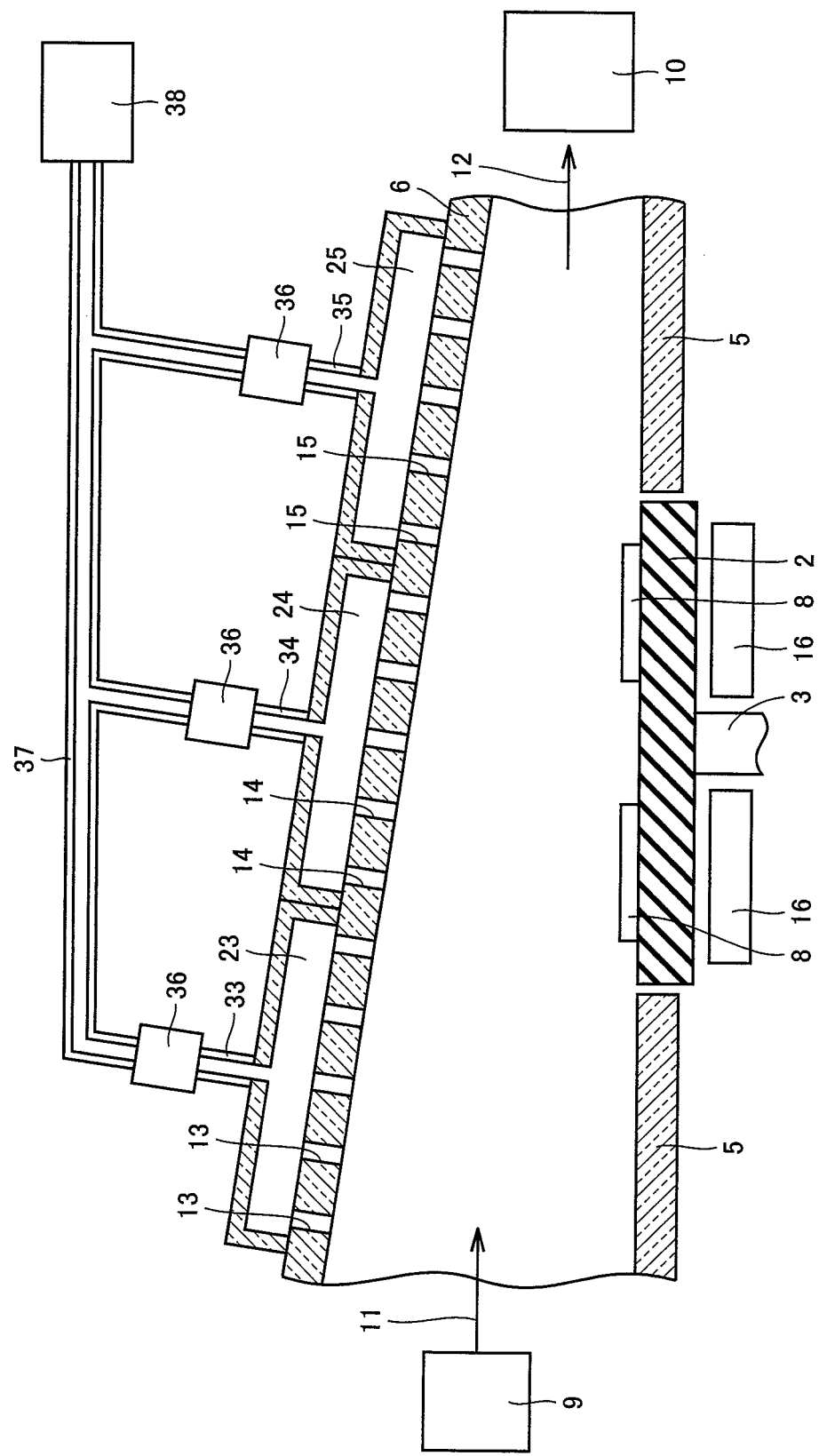
FIG. 7 is a schematic cross-sectional view showing Embodiment 2 of a vapor-phase process apparatus according to the present invention.

Vapor-phase process apparatus 1 shown in FIG. 7 has a structure basically the same as that of the vapor-phase process apparatus shown in FIGS. 1 and 2, however, it is different in that a height of process chamber 4 gradually decreases from the upstream toward the downstream in the direction of flow of the reaction gas. Namely, in vapor-phase process apparatus 1 shown in FIG. 7, arrangement is such that upper wall 6 of process chamber 4 is slightly inclined to come closer to bottom wall 5 from the upstream side toward the downstream side in the direction shown with arrow 11 indicating the direction of flow of the reaction gas (the direction of supply). According to such a structure as well, an effect the same as in the vapor-phase process apparatus shown in FIGS. 1 and 2 can be achieved.

In addition, in vapor-phase process apparatus 1 shown in FIG. 7, the height of process chamber 4 gradually decreases from the upstream toward the downstream in the direction of supply of the reaction gas. Therefore, when the purge gas is supplied from gas supply ports 13 to 15, an effect of pressing the reaction gas toward substrate 8 side can be more noticeable.

Embodiment 3

Embodiment 3 of the vapor-phase process apparatus according to the present invention will be described with reference to FIG. 8.

Figure 8:
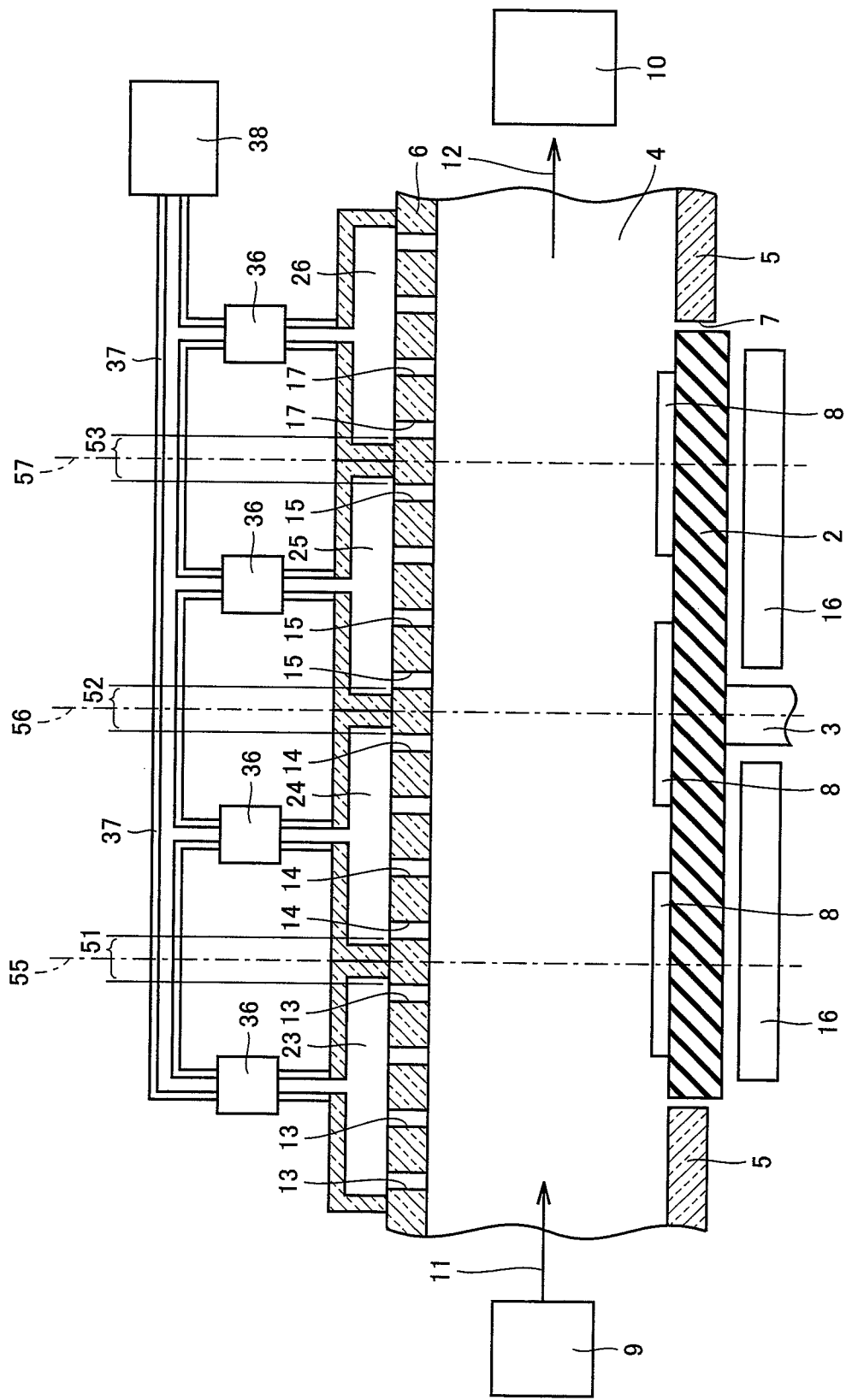
FIG. 8 is a schematic cross-sectional view showing Embodiment 3 of a vapor-phase process apparatus according to the present invention.

Vapor-phase process apparatus 1 shown in FIG. 8 has a structure basically the same as that of the vapor-phase process apparatus shown in FIGS. 1 and 2, however, it is different from the vapor-phase process apparatus shown in FIGS. 1 and 2 in a structure of a gas supply portion formed on upper wall 6 and a structure of susceptor 2. Specifically, in vapor-phase process apparatus 1 shown in FIG. 8, four buffer chambers 23 to 26 are arranged in line along a direction of flow of the reaction gas shown with arrow 11. Buffer chambers 23 to 26 are connected to gas supply member 38 through respective independent flow rate control devices 36 via pipes 37.

In addition, susceptor 2 in vapor-phase process apparatus 1 shown in FIG. 8 can carry three substrates 8 along the direction of flow of the reaction gas above. In FIG. 8, substrate 8 located in the center among three substrates is arranged at the substantial center of susceptor 2 in the direction of flow of the reaction gas. Then, a boundary portion 52 between gas supply port 14 serving as one gas introduction portion supplied with gas from buffer chamber 24 and gas supply port 15 serving as another gas introduction portion supplied with gas from buffer chamber 25 is arranged to include a segment 56 indicating the substantial center of susceptor 2. This position of boundary portion 52 is determined as follows.

Figure 9:
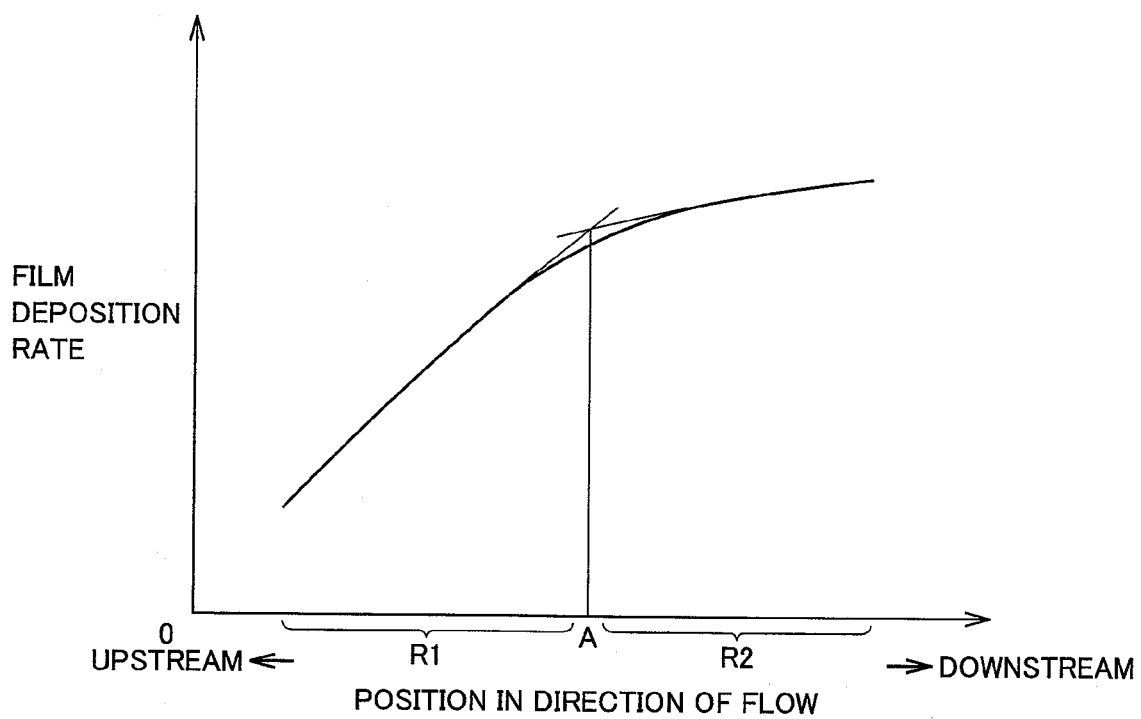
FIG. 9 is a graph showing data used for determining a position of a boundary portion between adjacent gas supply ports shown in FIG. 8.

Referring to FIG. 9, the abscissa indicates a position in the direction of flow of the reaction gas, and the ordinate indicates a film deposition rate (a process rate) when a film deposition process (a vapor-phase process) is performed without supplying a gas from gas supply ports 13 to 17. As shown in FIG. 9, it can be seen that the film deposition rate increases from the upstream toward the downstream. In addition, a rate of change in the film deposition rate is not constant but a rate of change in the film deposition rate (slope of the graph) varies between a region R1 in the upstream and a region R2 in the downstream, on opposing sides of a position A. In the graph shown in FIG. 9, the position serving as the boundary between the upstream region and the downstream region different in the rate of change in the film deposition rate is referred to as an inflection point and the position of the inflection point is denoted as position A.

Regarding a method of determining the position of the inflection point, the inflection point may be determined based on visual inspection of the graph or it may be determined as follows. For example, between an upstream end portion and a downstream end portion of susceptor 2 in the direction of flow of the reaction gas, based on data showing relation between the film deposition rate in a region occupying ⅓ on the upstream side and the position in the direction of flow of the reaction gas, a first straight line approximating that data by using the least-squares method is determined. In addition, between the upstream end portion and the downstream end portion of susceptor 2 above, based on data showing relation between the film deposition rate in a region occupying ⅓ on the downstream and the position in the direction of flow of the reaction gas, a second straight line approximating that data by using the least-squares method is determined. Then, a position of intersection of the first straight line and the second straight line (the position in the direction of flow of the reaction gas: position A in FIG. 9) is defined as the position of the inflection point. It is noted that the position of this inflection point is located at the substantial center of susceptor 2 in vapor-phase process apparatus 1 shown in FIG. 8.

Arrangement of gas supply ports 14 and 15 in upper wall 6 and buffer chambers 24 and 25 are determined such that segment 56 shown in FIG. 8 corresponds to the position of the inflection point (position A) thus determined. From a different point of view, arrangement of gas supply ports 14 representing a group of gas supply ports connected to buffer chamber 24, a group of gas supply ports 15 connected to buffer chamber 25, and buffer chambers 24 and 25 is determined such that boundary portion 52 in FIG. 8 includes position A above (position in the substantially central portion of susceptor 2).

In addition, arrangement of gas supply ports 13 and 14 and buffer chambers 23 and 24 is determined such that a boundary portion 51 between gas supply port 13 and gas supply port 14 in FIG. 8 is located between the position in the substantially central portion of susceptor 2 described above (the position shown with segment 56, from a different point of view, position A in FIG. 9) and the upstream end portion of susceptor 2 in the direction of flow of the reaction gas. Here, as shown in FIG. 8, a segment 55 passing through the substantially central portion of boundary portion 51 is arranged at a position corresponding to substrate 8 on the most upstream side mounted on susceptor 2 in the direction of flow of the reaction gas. In addition, more specifically, segment 55 passes through the substantially central portion of substrate 8 on the most upstream side above.

In addition, arrangement of gas supply ports 15 and 17 and buffer chambers 25 and 26 is determined such that a boundary portion 53 between gas supply port 15 and gas supply port 17 in FIG. 8 is located between the position in the substantially central portion of susceptor 2 described above (the position shown with segment 56) and the downstream side end portion of susceptor 2 in the direction of flow of the reaction gas. Here, as shown in FIG. 8, a segment 57 passing through the substantially central portion of boundary portion 53 is arranged at a position corresponding to substrate 8 on the most downstream side mounted on susceptor 2 in the direction of flow of the reaction gas. In addition, more specifically, segment 57 passes through the substantially central portion of substrate 8 on the most downstream side above.

Gas supply ports 13 to 17 and buffer chambers 23 to 26 can thus be arranged so that the purge gas of which flow rate is controlled can be supplied from each group of gas supply ports 13 to 17 into process chamber 4. In addition, by determining arrangement of boundary portions 51 to 53 of gas supply ports 13 to 17 as described above, controllability of the film deposition rate can be improved.

The vapor-phase process method shown in FIG. 5 can be performed also with the use of vapor-phase process apparatus 1 shown in FIG. 8, as in the case of vapor-phase process apparatus 1 shown in FIG. 1 and the like. Here, in the film deposition step (S20), for example, by setting a ratio between the flow rates of the purge gas from gas supply ports 13 to gas supply ports 17 to a prescribed ratio (such as 0:2:3:0), a rate of increase in the film deposition rate (vapor-phase process rate) in the direction of flow of the reaction gas can be substantially constant from the upstream toward the downstream.

Embodiment 4

Embodiment 4 of the vapor-phase process apparatus according to the present invention will be described with reference to FIGS. 10 to 12.

Figure 10:
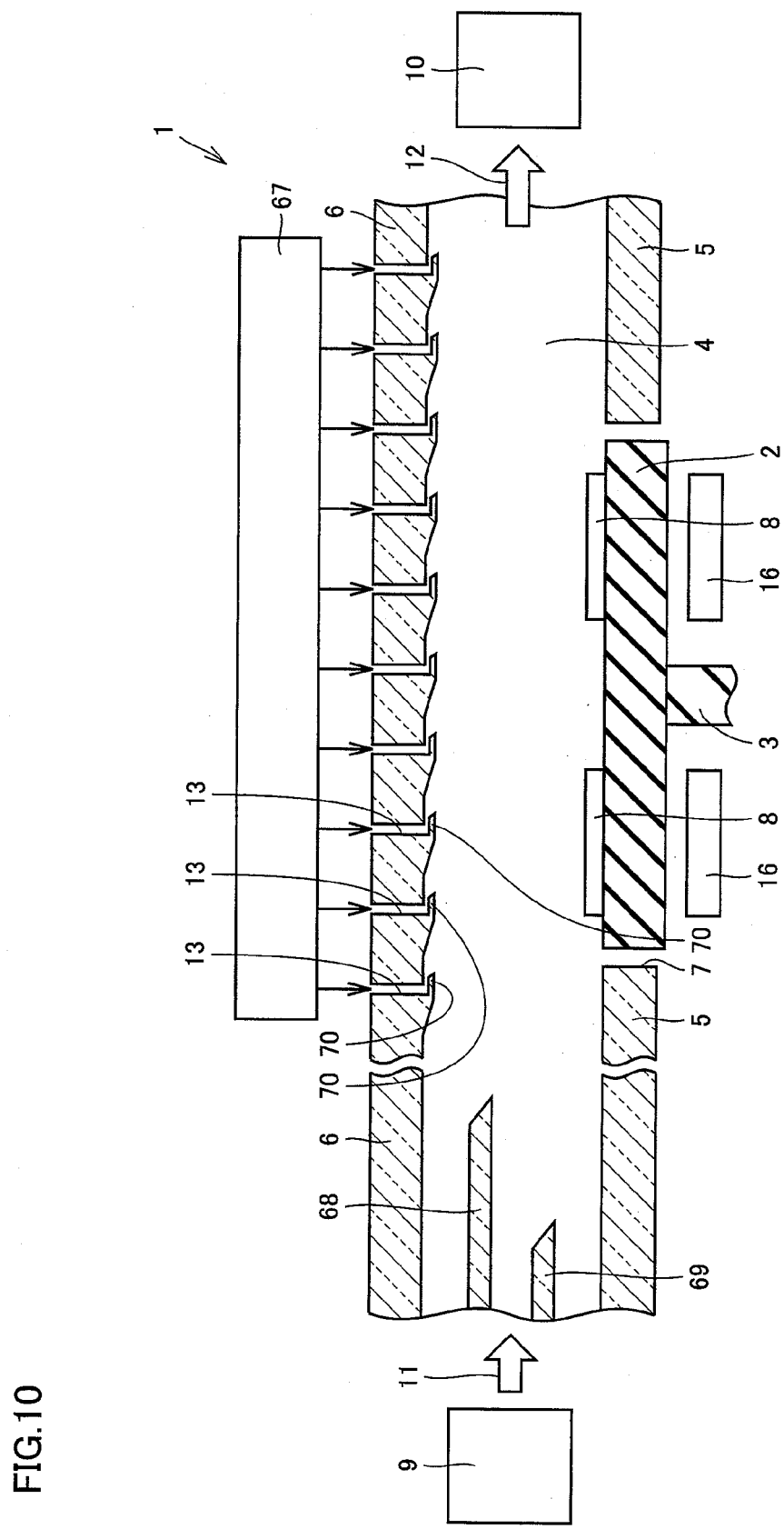
FIG. 10 is a schematic cross-sectional view showing Embodiment 4 of a vapor-phase process apparatus according to the present invention.
Figure 11:
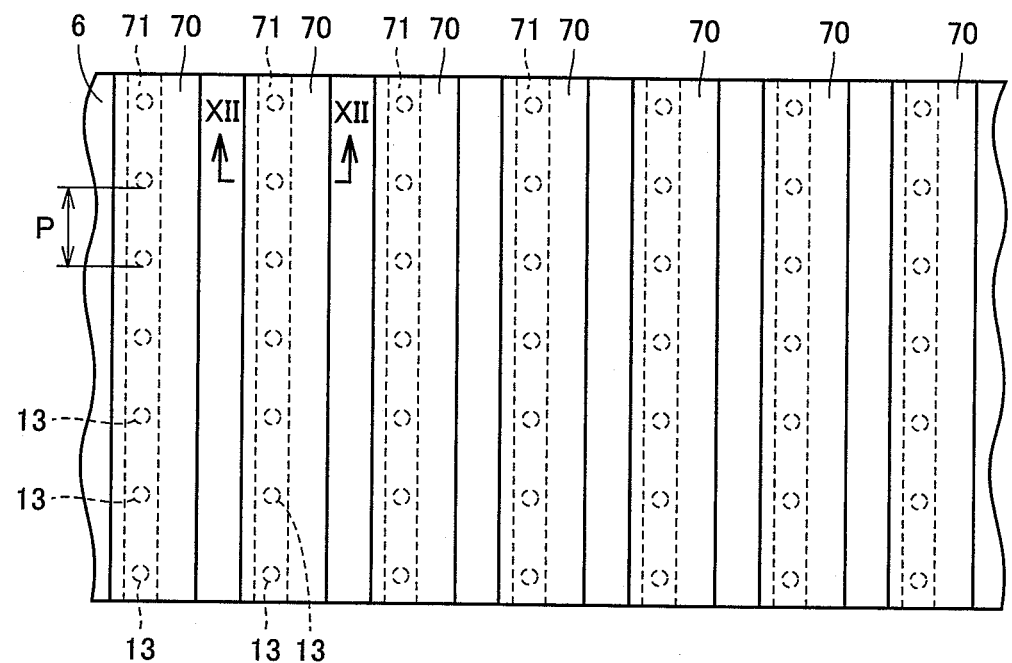
FIG. 11 is a schematic diagram of an upper wall of a process chamber of the vapor-phase process apparatus shown in FIG. 10 when viewed from a susceptor side.
Figure 12:
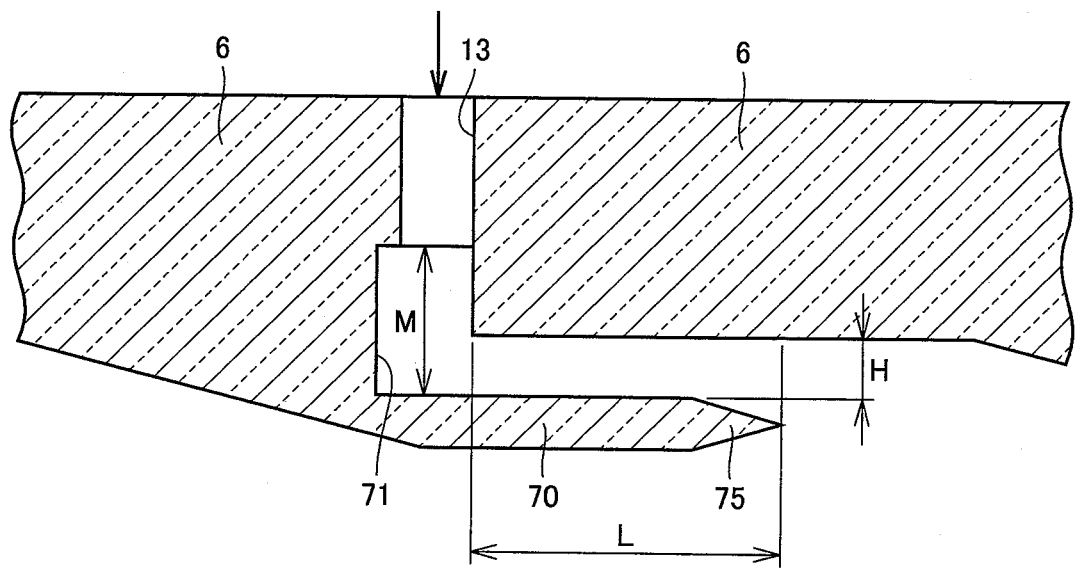
FIG. 12 is a partial schematic cross-sectional view along the line XII-XII in FIG. 11.

Referring to FIGS. 10 to 12, vapor-phase process apparatus 1 according to the present invention is a vapor-deposition apparatus, and it includes process chamber 4, susceptor 2 provided in opening 7 in the bottom wall of process chamber 4, a plurality of gas supply ports 13 formed in upper wall 6 of process chamber 4, flow-guide plate 70 provided on an exit side of gas supply port 13, reaction gas supply member 9, gas exhaust member 10, and a gas supply portion 67 for supplying the purge gas to gas supply ports 13. Process chamber 4 is a hollow body having a rectangular cross-section in a direction perpendicular to the direction of flow of the reaction gas as shown with arrows 11 and 12.

Opening 7 having an annular two-dimensional shape is formed in bottom wall 5 of process chamber 4. Susceptor 2 is arranged in this opening 7. Susceptor 2 also has an annular two-dimensional shape. An upper surface of susceptor 2 serves as a substrate mount surface carrying substrate 8 which is a process object. In addition, rotation shaft 3 is connected to the central portion of the back surface of susceptor 2, which is a surface opposite to the substrate mount surface. As in vapor-phase process apparatus 1 shown in FIG. 1 and the like, rotation shaft 3 is connected to a not-shown drive source such as a motor. Susceptor 2 is rotatable around the central portion connected to rotation shaft 3, as a result of transmission of motive power from the drive source described above through rotation shaft 3. In addition, heater 16 for heating substrate 8 through susceptor 2 is provided on the back side of susceptor 2.

A plurality of gas supply ports 13 are formed in upper wall 6 of process chamber 4 along the direction of flow of the reaction gas as shown with arrows 11 and 12. In addition, the plurality of gas supply ports are formed at an interval (pitch P) in the direction of width, which is a direction intersecting the direction of flow of the reaction gas described above, as shown in FIG. 11 (specifically, the direction perpendicular to the direction of flow of the reaction gas). Namely, a plurality of gas supply ports 13 are formed in matrix in upper wall 6 of process chamber 4. Then, flow-guide plate 70 is formed to cover the exit of gas supply port 13 on an inner side of process chamber 4. Flow-guide plate 70 is formed to extend along the direction of width of process chamber 4 as shown in FIG. 11. As shown in FIG. 12, flow-guide plate 70 is connected to upper wall 6 on the side upstream of gas supply port 13 in the direction of flow of the reaction gas, and formed to extend from upper wall 6, from that connection portion toward the side downstream of gas supply port 13 (extend in parallel to the surface of upper wall 6). In addition, from a different point of view, flow-guide plate 70 is connected to upper wall 6 on the side upstream of a plurality of gas supply ports 13 aligned in the direction of width of process chamber 4. The connection portion between flow-guide plate 70 and upper wall 6 is arranged to extend in the direction of chamber width, on the side upstream of a plurality of gas supply ports 13 aligned in the direction of chamber width.

In addition, as shown in FIG. 12, a groove 71 is formed in gas supply port 13 on the inner side of process chamber 4. Groove 71 is formed to have a width greater than a diameter of gas supply port 13 (in the direction of flow of the reaction gas) and to extend along the direction of width of process chamber 4, as shown in FIGS. 11 and 12. Namely, this groove 71 has a function as a buffer chamber that once stores the purge gas supplied from gas supply port 13. A height M of this groove 71 is greater than a distance H between flow-guide plate 70 and upper wall 6 of process chamber 4. In addition, regarding L representing a distance from an end portion of gas supply port 13 to a tip end portion of flow-guide plate 70, H representing a distance between flow-guide plate 70 and upper wall 6 described above, and pitch P representing a distance between adjacent gas supply ports 13 shown in FIG. 11, relation of $L/PH \geq 20$ is preferably satisfied. Here, length L, distance H, and pitch P are expressed in millimeter (mm).

In addition, a tip end portion 75 of flow-guide plate 70 may be in a simple rectangular shape, however, it may have a wedge-shaped cross-section as shown in FIG. 12. Further, an angle formed by this tip end portion 75 is preferably 90° or smaller. Moreover, a position of a portion forming an acute angle at this tip end portion 75 may be located in the substantially central portion in a direction of thickness of flow-guide plate 70 as shown in FIG. 12, however, the tip end portion may be located at any other location.

The purge gas is supplied from gas supply portion 67 to each of gas supply ports 13. Gas supply portion 67 may supply the purge gas of which flow rate is independently controlled for each gas supply port 13. Specifically, the flow rate control device or the like may be provided to a pipe connected to each gas supply port 13. Alternatively, for example as shown in FIG. 1, a plurality of gas supply ports 13 may be divided into a plurality of groups such as two, three or more groups, a pipe common to each of these groups may be connected, and the flow rate control device may be provided to each pipe, so that the flow rate is different for each group. Namely, a structure constituted of gas supply member 38, pipe 37, flow rate control device 36, pipes 33 to 35, buffer chambers 23 to 25, and the like shown in FIG. 1 may be adopted as a structure of gas supply portion 67 shown in FIG. 10. Alternatively, the flow rate of the purge gas may be controlled independently for each of a plurality of gas supply ports 13 aligned in the direction of width of process chamber 4, or the plurality of gas supply ports 13 aligned in the direction of width may be divided into a plurality of groups as described above and the flow rate of the purge gas may be set differently for each group. In this case as well, the flow rate of the purge gas can independently be controlled by providing a flow rate control device in each pipe connected to each of the plurality of gas supply ports 13 aligned in the direction of width or in a pipe commonly used for each group.

From reaction gas supply member 9 supplying the reaction gas to process chamber 4, the reaction gas is supplied into process chamber 4 as shown with arrow 11. Here, in order to supply a plurality of types of reaction gases into process chamber 4, partition plates 68 and 69 for partitioning a gas flow path in a portion for supplying the reaction gas into process chamber 4 in a direction of thickness are provided. These two partition plates 68 and 69 establish such a state that the flow path of the gas supplied into process chamber 4 is divided on an entrance side into three layers in the direction of thickness. The reaction gases supplied as such are used for a process in process chamber 4, and thereafter exhausted from process chamber 4 by gas exhaust member 10 as shown with arrow 12.

Figure 13:
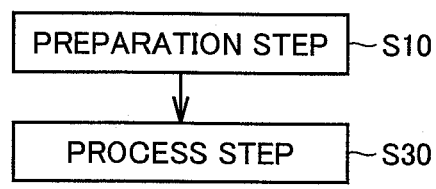
FIG. 13 is a flowchart for illustrating a vapor-phase process method with the use of the vapor-phase process apparatus shown in FIG. 10.

A vapor-phase process method using the vapor-phase process apparatus shown in FIGS. 10 to 12 will now be described. Referring to FIG. 13, the vapor-phase process method using the vapor-phase process apparatus according to the present invention shown in FIG. 10 is a vapor-deposition method, and initially, a preparation step (S10) is performed. In the preparation step (S10), substrate 8 which is a process object is mounted on susceptor 2.

Then, a process step (S30) is performed as shown in FIG. 13. Specifically, pressure in process chamber 4 in which substrate 8 is arranged is reduced to a prescribed pressure. Here, gas exhaust member 10 is used to exhaust an atmospheric gas in process chamber 4, to adjust the pressure in process chamber 4. Then, susceptor 2 and substrate 8 are heated by heater 16 to set a prescribed temperature condition. In this state, the reaction gas is supplied from reaction gas supply member 9 into process chamber 4 as shown with arrow 11 in FIG. 10. Here, the purge gas is supplied from gas supply portion 67 through gas supply ports 13, from upper wall 6 side of process chamber 4 into process chamber 4.

For example, in an example where a GaN substrate is used as substrate 8 and a GaN film is epitaxially grown on substrate 8, an ammonia gas, a trimethylgallium (TMG) gas and the like may be used as the reaction gas supplied from reaction gas supply member 9. For example, the ammonia gas is supplied from a reaction gas supply portion at a position closest to bottom wall 5 of process chamber 4 (below partition plate 69). Then, trimethylgallium (TMG) which is an organic metal and a carrier gas (hydrogen gas) are supplied from a reaction gas supply portion located in the center in a direction of height on the upstream side of process chamber 4 (between partition plate 68 and partition plate 69). Then, a carrier gas (nitrogen gas) is supplied from a reaction gas supply portion uppermost in the direction of height on the upstream side of process chamber 4 (above partition plate 68).

Here, any gas supplied from reaction gas supply member 9 described above (such as a nitrogen gas, an ammonia gas, or a gas mixture thereof) may be used as the purge gas fed to gas supply ports 13.

Consequently, a prescribed film is formed on the surface of substrate 8. The resultant substrate is such epitaxial-layer-including substrate 49 that epitaxial layer 48 is formed on the surface of substrate 8 as shown in FIG. 6.

Here, in epitaxial-layer-including substrate 49 subjected to the process in the present example, surface density of defects having a diameter not smaller than 5 μm observed with an optical microscope was not higher than 1 $cm^{-2}$. At the same time, the index indicating uniformity of epitaxial layer 48 when the flow rate of the purge gas from gas supply ports 13 was optimized (a value obtained by dividing a difference between a maximum value and a minimum value of a thickness of epitaxial layer 48 by an intermediate value therebetween) was not greater than 1%. Data of thickness of epitaxial layer 48 for calculating the index described above can be obtained, for example, by optical interferometry or an X-ray diffraction method. Specifically, a thickness of epitaxial layer 48 is measured at 1 mm pitch with optical interferometry over the entire substrate surface on which epitaxial layer 48 has been formed, and the maximum value and the minimum value of the thickness as well as the intermediate value therebetween are calculated from the measurement data of the entire surface of the substrate. Then, the value of the index above can be calculated from the obtained data.

Embodiment 5

Embodiment 5 of the vapor-phase process apparatus according to the present invention will be described with reference to FIGS. 14 and 15. It is noted that FIG. 14 corresponds to FIG. 11 and FIG. 15 corresponds to FIG. 12.

Figure 14:
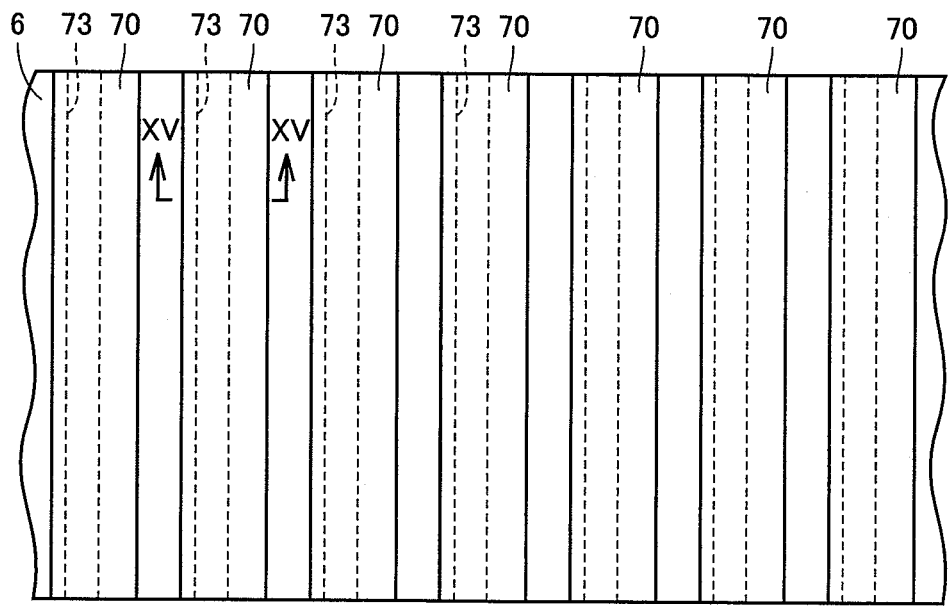
FIG. 14 is a schematic diagram showing Embodiment 5 of a vapor-phase process apparatus according to the present invention.
Figure 15:
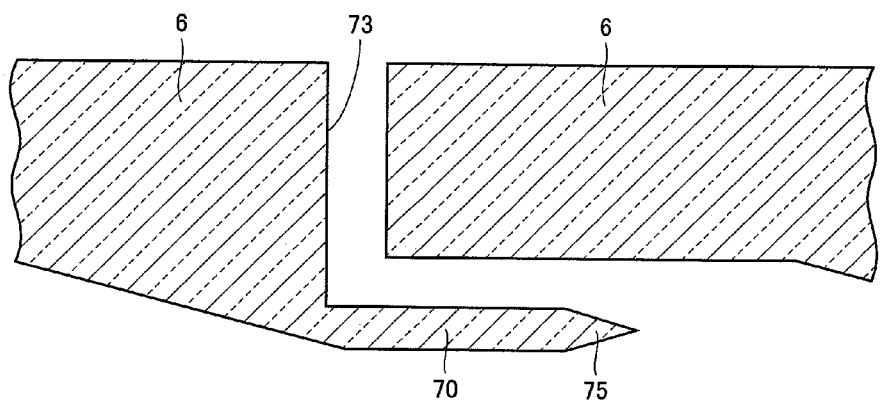
FIG. 15 is a partial schematic cross-sectional view along the line XV-XV in FIG. 14.

As shown in FIGS. 14 and 15, Embodiment 5 of the vapor-phase process apparatus according to the present invention has a structure basically the same as that of vapor-phase process apparatus 1 shown in FIGS. 10 to 12, however, it is different in a structure for supplying the purge gas formed in upper wall 6 of process chamber 4 (see FIG. 10). Specifically, the vapor-phase process apparatus shown in FIGS. 14 and 15 is different from the vapor-phase process apparatus shown in FIGS. 10 to 12 in that a gas supply slit 73 is formed in upper wall 6 to extend in the direction of width, instead of gas supply port 13 having an annular two-dimensional shape as shown in FIG. 10 and the like. According to such a structure, a supply flow rate of the purge gas in the direction of width of process chamber 4 can be more uniform.

It is noted that a groove as shown in FIG. 12 may be formed at a lower end (on flow-guide plate 70 side) of gas supply slit 73. For example, the groove may have a width greater than a width of gas supply slit 73 in the direction of flow of the reaction gas. In this case, the groove serves as a buffer chamber so that uniformity of flow velocity of the purge gas can further be improved.

Embodiment 6

Embodiment 6 of the vapor-phase process apparatus according to the present invention will be described with reference to FIG. 16. It is noted that FIG. 16 corresponds to FIG. 10.

Figure 16:
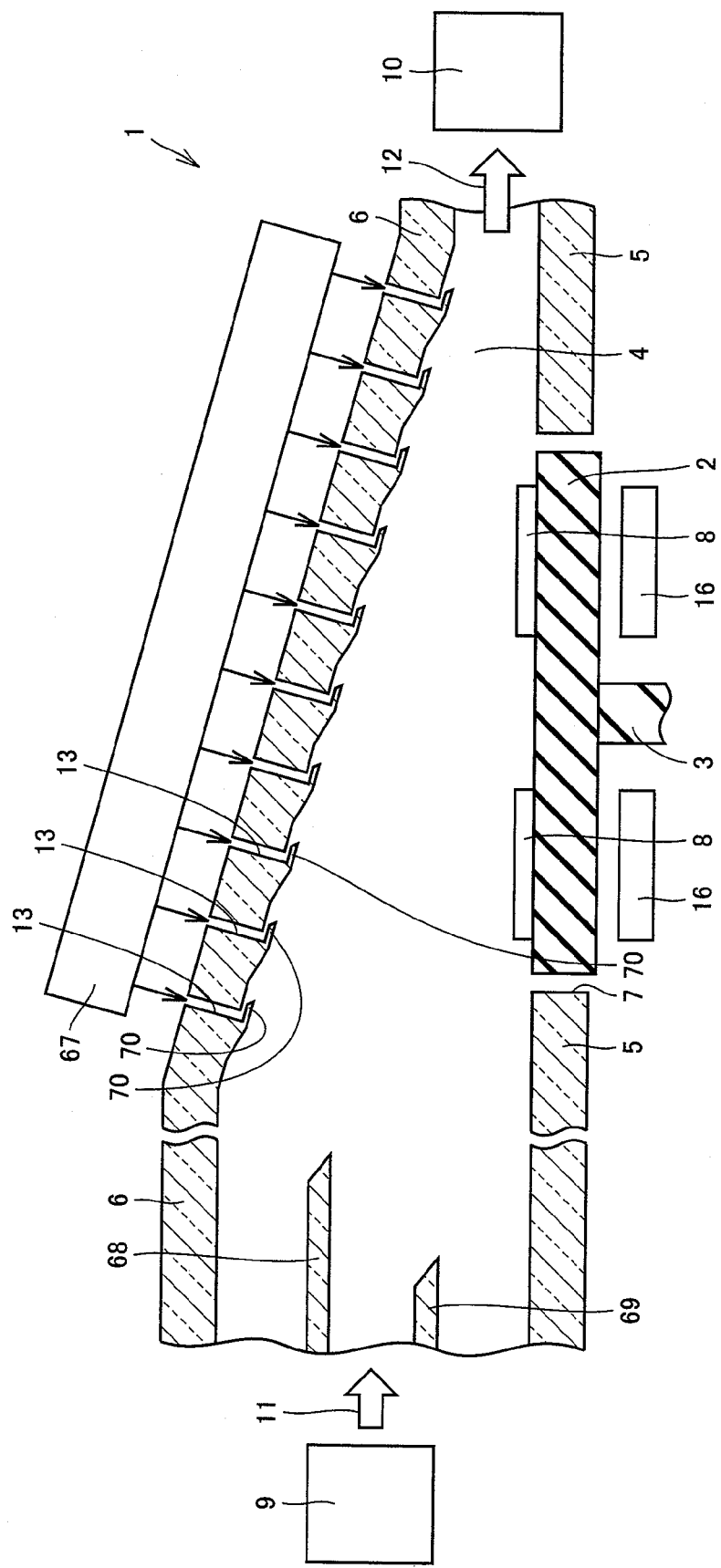
FIG. 16 is a schematic cross-sectional view showing Embodiment 6 of a vapor-phase process apparatus according to the present invention.

Vapor-phase process apparatus 1 shown in FIG. 16 has a structure basically the same as that of vapor-phase process apparatus 1 shown in FIGS. 10 to 12, however, it is different in that upper wall 6 of process chamber 4 is inclined to come closer to bottom wall 5 from the upstream toward the downstream in the direction along arrows 11 and 12 indicating the direction of flow of the reaction gas (the direction of supply). Namely, the height of process chamber 4 is gradually smaller from the upstream toward the downstream in the direction of supply of the reaction gas, in particular in a region opposed to susceptor 2. Thus, in addition to the effect obtained by the vapor-phase process apparatus shown in FIGS. 10 to 12, it is ensured that the reaction gas supplied from reaction gas supply member 9 is pressed toward substrate 8 side by the purge gas supplied from gas supply ports 13. Accordingly, uniformity of reaction in the film deposition process or the like and the film deposition rate at the surface of substrate 8 can be improved.

Figure 17:
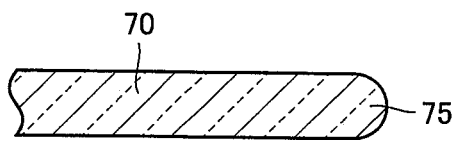
FIGS. 17 to 19 are schematic cross-sectional views showing variations of a shape of a tip end portion of a flow-guide plate in the vapor-phase process apparatus shown in FIG. 16.
Figure 18:
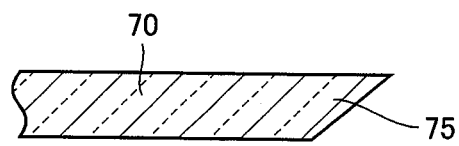
Figure 19:

FIGS. 17 to 19 are schematic cross-sectional views showing variations of a shape of the tip end portion of the flow-guide plate in the vapor-phase process apparatus shown in FIG. 16. Variations of tip end portion 75 of flow-guide plate 70 in vapor-phase process apparatus 1 shown in FIG. 16 will be described with reference to FIGS. 17 to 19.

Tip end portion 75 of flow-guide plate 70 shown in FIG. 17 has a semicircular cross-sectional shape. Alternatively, as shown in FIG. 18, tip end portion 75 of flow-guide plate 70 may be in a shape having an end surface inclined toward not-shown upper wall 6 (see FIG. 16) of process chamber 4 (that is, such a shape that a position of the end surface of tip end portion 75 gradually comes closer to upper wall 6 (see FIG. 16) in a direction toward the tip end side of flow-guide plate 70). Alternatively, as shown in FIG. 19, the end surface of tip end portion 75 may be inclined slightly away from upper wall 6 (see FIG. 16) described above. A cross-sectional shape of tip end portion 75 of flow-guide plate 70 may be selected as appropriate, depending on the flow rate of the purge gas or the flow rate of the reaction gas.

Embodiment 7

Embodiment 7 of the vapor-phase process apparatus according to the present invention will be described with reference to FIG. 20. It is noted that FIG. 20 corresponds to FIG. 10.

Figure 20:
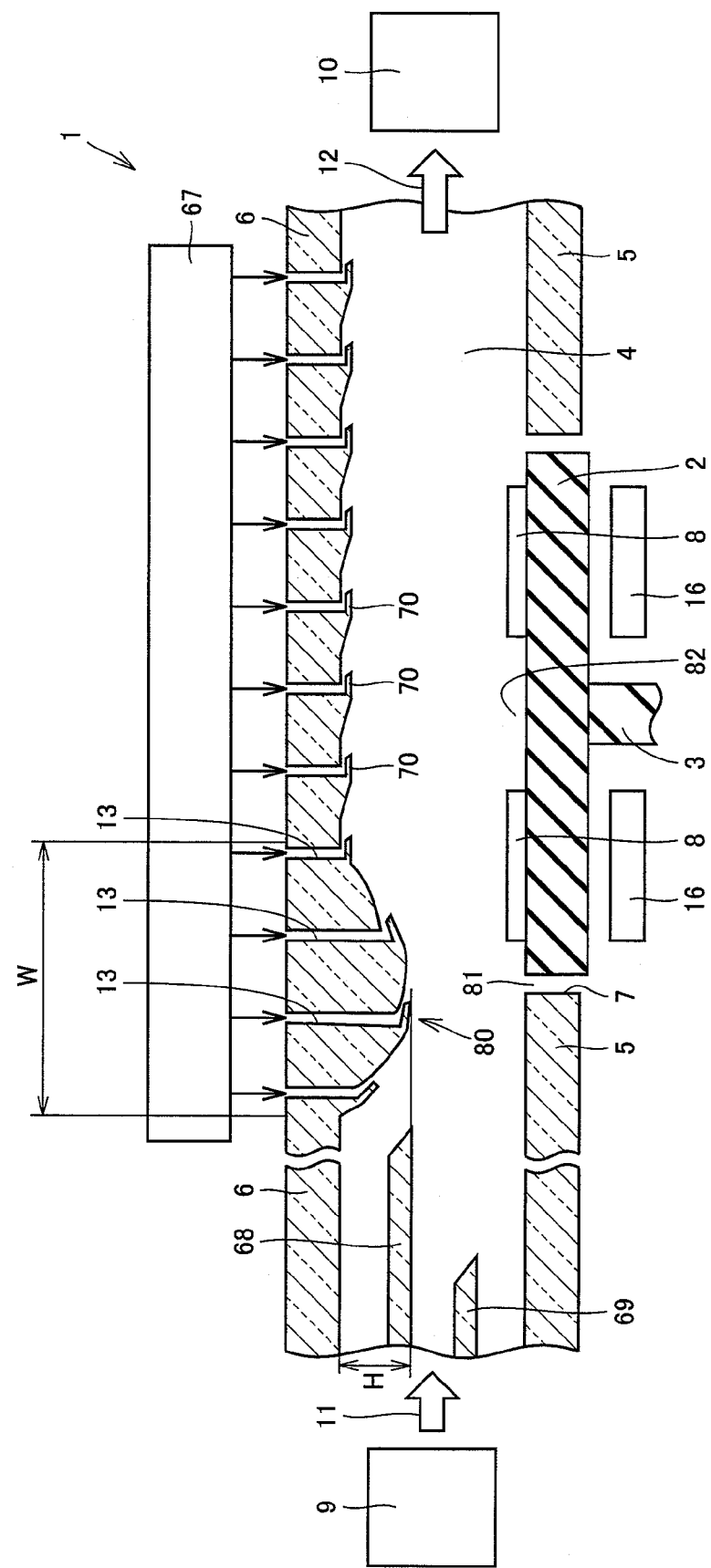
FIG. 20 is a schematic cross-sectional view showing Embodiment 7 of a vapor-phase process apparatus according to the present invention.

Referring to FIG. 20, vapor-phase process apparatus 1 has a structure basically the same as that of vapor-phase process apparatus 1 shown in FIGS. 10 to 12, however, it is different in that a projection portion 80 is formed in upper wall 6 of process chamber 4. Namely, on upper wall 6 of process chamber 4, projection portion 80 is formed substantially in a position opposed to an upstream side end portion 81 of susceptor 2. Projection portion 80 projects toward bottom wall 5 by a height H from the surface of upper wall 6, projection starting from a region of upper wall 6 of process chamber 4 upstream of projection portion 80. In addition, in the direction of flow of the reaction gas (the direction of supply), projection portion 80 has a width W. Height H and width W above can be set to any values. In addition, a position of a peak portion of projection portion 80 (a portion of projection portion 80 closest to bottom wall 5) is preferably located at a position corresponding to upstream side end portion 81 of susceptor 2 in the direction of supply of the reaction gas, or on the side upstream of upstream end portion 81. Gas supply ports 13 are formed in projection portion 80, as in other portions of upper wall 6.

Moreover, projection portion 80 is formed to extend in the direction intersecting the direction of supply of the reaction gas (the direction of chamber width). Projection portion 80 may be formed to extend linearly in the direction of width above, or it may be formed to extend, for example, in an arc shape along an outer circumference of susceptor 2. Further, a downstream side end portion of projection portion 80 is preferably located upstream of a central portion 82 of susceptor 2.

In addition, regarding an outer shape of a cross-section of projection portion 80 in the direction along the direction of flow of the reaction gas (a shape formed by connecting outermost portions with a virtual line), the surface is preferably curved, for example, in a semicircular shape. Here, a degree of disturbance brought about by projection portion 80, of flow of the reaction gas that flows substantially in a laminar flow state can be less and the reaction gas can be directed more effectively toward substrate 8 side.

By adopting such a structure, not only an effect as in vapor-deposition apparatus 1 shown in FIGS. 10 to 12 can be obtained, but also the purge gas or the reaction gas flows along projection portion 80 on the upstream portion of susceptor 2. Therefore, a sufficient reaction gas can be supplied to the surface of substrate 8 held on susceptor 2, on the upstream portion of susceptor 2.

The vapor-phase process method using vapor-phase process apparatus 1 shown in FIG. 20 described above is basically the same as the vapor-phase process method using vapor-phase process apparatus 1 shown in FIGS. 10 to 12. In the step corresponding to the process step (S30) shown in FIG. 13, however, regarding the distance between upper wall 6 and bottom wall 5 which is the other wall portion opposed to upper wall 6 which is a wall portion opposed to substrate 8, as the distance at upstream side end portion 81 of susceptor 2 in the direction of flow of the reaction gas is smaller than the distance at central portion 82 of susceptor 2 in the direction of flow of the reaction gas, diffusion of the reaction gas toward the bottom wall in the former portion can be promoted and the process of the substrate on the side upstream of central portion 82 of susceptor 2 can be promoted. Specifically, for example, when a process for depositing an InGaN film is performed as the vapor-phase process, a rate of film deposition of InGaN on substrate 8 or an In composition can be improved.

In the embodiment described above, the vapor deposition apparatus has been described by way of example of vapor-phase process apparatus 1, however, features such as gas supply port 13, groove 71, gas supply slit 73, or flow-guide plate 70 in the vapor-phase process apparatus according to the present invention may be applicable to other vapor-phase process apparatuses such as a dry etching apparatus. In addition, the variation of the shape of the tip end portion of the flow-guide plate shown in FIGS. 17 to 19 may be applicable to vapor deposition apparatus 1 shown in FIGS. 10 to 12 above or other embodiments. In addition, even when gas supply ports 13, flow-guide plates 70 and the like are not provided in projection portion 80 of upper wall 6, the process of the substrate can be promoted. Moreover, features such as flow-guide plate 70 or gas supply port 13 described in Embodiment 4 to Embodiment 7 may be applicable to vapor-phase process apparatus 1 shown in Embodiment 1 to Embodiment 3.

Though the description may partially be redundant, characteristic features of the present invention will be enumerated. Vapor-phase process apparatus 1 according to the present invention includes process chamber 4, gas supply ports 13 to 15 serving as a plurality of gas introduction portions, and the gas supply portion (gas supply member 38, pipe 37, flow rate control device 36, pipes 33 to 35, and buffer chambers 23 to 25 and 24a to 24c). Process chamber 4 allows flow of the reaction gas therein. A plurality of gas supply ports 13 to 15 are formed in the wall surface of process chamber 4 (upper wall 6 shown in FIG. 1 or sidewall 40 shown in FIG. 3) along the direction of flow of the reaction gas. The gas supply portion can supply the gas into process chamber 4 at a different flow rate from each of one gas supply port (any one of gas supply ports 13 to 15) and another gas supply port (another one of gas supply ports 13 to 15) different from that one gas supply port, among the plurality of gas supply ports 13 to 15.

Thus, an amount of supply of the gas from the plurality of gas supply ports 13 to 15 can thus locally be changed by means of the gas supply portion, so that a state of supply of the gas supplied from gas supply ports 13 to 15 to process chamber 4 can arbitrarily be changed depending on a type or the like of a process such as a film deposition process (more specifically, a gas flow state in process chamber 4). Therefore, by optimizing the state of supply of the gas supplied from gas supply ports 13 to 15 depending on a type of a process, process quality such as uniformity of a process such as film deposition can be improved.

In vapor-phase process apparatus 1 above, a plurality of gas supply ports 13 to 15 are formed in the wall surface (upper wall 6) of process chamber 4 also in the direction of width intersecting the direction of flow of the reaction gas (the direction in which the reaction gas flows), as shown in FIG. 2 or the like. The gas supply portion may be able to supply the gas into process chamber 4 at a different flow rate from each of one gas supply port (gas supply port 14 located under buffer chamber 24a in FIG. 4) and an additional gas supply port (a gas supply port located under buffer chamber 24b or buffer chamber 24c in FIG. 4) formed at a position different from that of one gas supply port 14 in the direction of width among a plurality of gas supply ports 14 formed in the wall surface in the direction of width.

Here, flow rate distribution or the like of the gas supplied from gas supply ports 14 can arbitrarily be changed also in the direction of width which is a direction intersecting the direction of flow of the reaction gas. Therefore, the state of supply of the gas supplied from gas supply ports 13 to 15 can more accurately be adjusted.

In vapor-phase process apparatus 1 above, as shown in FIG. 3, gas supply ports 14 may be formed not only in upper wall 6 of process chamber 4 but also in sidewall 40. In addition, in vapor-phase process apparatus 1 described above, a plurality of gas supply ports 13 to 15 are divided into groups located under any respective identical buffer chambers 23 to 25 and 24a to 24c in the direction of flow of the reaction gas or in the direction of width, so that the flow rate of the purge gas can be changed for each group, however, the flow rate control device may be provided for each of gas supply ports 13 to 15 so that the flow rate can individually be controlled.

Vapor-phase process apparatus 1 above may further include susceptor 2 carrying substrate 8 serving as a process object arranged in process chamber 4, as shown in FIG. 8. A plurality of gas introduction portions (gas supply ports 13 to 17) may include one gas introduction portion (gas supply ports 14), another gas introduction portion (gas supply ports 15), and yet another gas introduction portion (gas supply ports 13) formed along the direction of flow of the reaction gas. The gas supply portion above may be able to supply the gas (such as the purge gas) into process chamber 4 at a different flow rate from each of one gas introduction portion (gas supply port 14), another gas introduction portion (gas supply port 15), and yet another gas introduction portion (gas supply port 13). The first boundary portion (boundary portion 52 in FIG. 8) between gas supply port 14 and gas supply port 15 in the direction of flow of the reaction gas may be arranged to include a position serving as an inflection point (position A in FIG. 9 or the position of segment 56 passing through the center of susceptor 2 in FIG. 8) in the direction of flow of the reaction gas, of a process rate when a vapor-phase process with the reaction gas is performed while the gas is not supplied into process chamber 4 from the plurality of gas introduction portions (gas supply ports 13 to 17). The second boundary portion (boundary portion 51 in FIG. 8) between gas supply port 14 and gas supply port 13 in the direction of flow of the reaction gas may be arranged at a position between an upstream side end portion of susceptor 2 in the direction of flow of the reaction gas and boundary portion 52 above.

Here, controllability in controlling the vapor-phase process rate in the direction of flow of the reaction gas by adjusting the amount of supply of the gas from gas supply ports 13 to 17 can be improved. Namely, by arranging gas supply ports 14 and 15 on opposing sides of the position of the inflection point of the vapor-phase process rate while the gas is not supplied from gas supply ports 13 to 17, the amount of supply of the gas from the gas supply ports can individually be changed for each region different in the rate of change in the vapor-phase process rate. Accordingly, such control as making the rate of change in the vapor-phase process rate in the direction of flow of the reaction gas closer to constant can readily be achieved. If the rate of change in the vapor-phase process rate can thus be made constant, uniformity of the rate of the vapor-phase process on substrate 8 can be improved by rotating the susceptor.

In addition, vapor-phase process apparatus 1 according to the present invention includes process chamber 4 in which the reaction gas flows, the gas introduction portions (gas supply ports 13, grooves 71, and gas supply slits 73), and flow-guide plates 70. The plurality of gas introduction portions are formed in the wall portion (upper wall 6) of process chamber 4 in the direction of flow of the reaction gas (the direction shown with arrows 11 and 12). Flow-guide plate 70 is formed to cover the gas introduction portion in process chamber 4. Flow-guide plate 70 guides the gas (purge gas) supplied from the gas introduction portion into the process chamber such that the gas flows in the direction along the direction of flow of the reaction gas. Flow-guide plate 70 is formed to extend in the direction of width, which is the direction intersecting the direction of flow of the reaction gas, in upper wall 6 of process chamber 4 where the gas introduction portions are formed.

Thus, the purge gas guided by flow-guide plate 70 (such as the purge gas blown from between the surface of upper wall 6 where the gas introduction portions are formed and flow-guide plate 70) forms the gas layer on the surface of upper wall 6 of process chamber 4. Then, this gas layer lowers the possibility that the reaction gas reaches the surface of upper wall 6 of process chamber 4. Consequently, an amount of deposits originating from the reaction gas on upper wall 6 can be reduced. Accordingly, the possibility that foreign substances such as deposit pieces formed as a result of peel-off of deposits from the surface of upper wall 6 float in process chamber 4 and adhere to the surface of substrate 8 serving as the process object can be lowered. Therefore, lower quality of a process such as a film deposition process or an etching process due to adhesion of such foreign substances can be suppressed.

In addition, as flow-guide plate 70 extending in the direction of chamber width is employed, a uniform gas layer can be formed without extremely increasing the number of gas supply ports 13 and the like. In addition, the plurality of gas introduction portions are formed in the direction of chamber width, and flow-guide plate 70 is formed to cover these plurality of gas introduction portions (gas supply ports 13) aligned in the direction of width and to have an opening on the downstream side in the direction of flow of the reaction gas (the direction shown with arrows 11 and 12). Therefore, flow velocity distribution of the purge gas in the direction of width can further be uniform.

In addition, formation of a uniformly flowing gas layer as described above on the surface of upper wall 6 brings about a noticeable effect of increase in flow velocity of the reaction gas in the downstream portion in the direction of flow of the reaction gas. Accordingly, a growth rate on the downstream, for example, of an epitaxial film, can be increased. Here, in achieving a uniform thickness of the film formed on substrate 8 by rotating susceptor 2, a film thickness cannot sufficiently be uniform only by rotating susceptor 2 if increase in the growth rate of the film in the downstream portion is insufficient. By using vapor-phase process apparatus 1 according to the present invention, however, the growth rate in the downstream portion can be increased and uniformity of the film deposition process on substrate 8 (such as uniformity of thickness or quality of the formed film) can be ensured.

In vapor-phase process apparatus 1 above, flow-guide plate 70 is arranged to cover the gas introduction portion such as gas supply port 13 or gas supply slit 73, with a gap from the surface of upper wall 6. The gap between the surface of upper wall 6 and flow-guide plate 70 communicates with the inside of process chamber 4 through the opening located on the downstream side in the direction of flow of the reaction gas. Here, the purge gas introduced from the gas introduction portions can reliably be guided by flow-guide plate 70 toward the downstream side in the direction of flow of the reaction gas.

In vapor-phase process apparatus 1 above, flow-guide plate 70 has a length in the direction of width equal to the length of process chamber 4 in the direction of chamber width, as shown in FIG. 11. Here, uniformity of the guided purge gas in the direction of width can readily be improved, as compared with an example where flow-guide plate 70 is divided into a plurality of pieces in the direction of chamber width. In addition, in maintenance of vapor-phase process apparatus 1 as well, since the number of members constituting flow-guide plate 70 can be smaller than in the example where flow-guide plate 70 is divided in the direction of width of process chamber 4, time and effort for maintenance can be lessened.

In vapor-phase process apparatus 1 above, a plurality of gas introduction portions (gas supply ports 13) may be formed in the direction of width as shown in FIG. 11. As shown in FIG. 12, a size of flow-guide plate 70 and arrangement of gas supply ports 13 are determined to satisfy relation of $$L/PH \geq 20$$

where L represents a distance from a rear end of gas supply port 13 to a rear end of flow-guide plate 70 in the direction of flow of the reaction gas, H represents a distance between the wall portion (upper wall 6) opposed to flow-guide plate 70 and flow-guide plate 70, and P represents a distance (pitch) between gas supply ports 13 adjacent in the direction of width as shown in FIG. 11. Here, the flow velocity of the purge gas in the direction of width becomes sufficiently uniform by the time the purge gas is discharged from the rear end of flow-guide plate 70 along the surface of upper wall 6.

In vapor-phase process apparatus 1 above, as shown in FIGS. 11 and 12, the gas introduction portions may include gas supply ports 13 serving as a gas introduction hole formed in upper wall 6, and groove 71 serving as a buffer chamber. Groove 71 is connected to gas supply port 13 and has a width greater than a width of gas supply port 13. Here, the purge gas is once stored in groove 71 from gas supply port 13, so that influence such as pressure fluctuation or the like of the purge gas supplied from gas supply port 13 to groove 71 is mitigated and the purge gas at a stable flow rate can be supplied into process chamber 4. In addition, as groove 71 serving as the buffer chamber has a width greater than a width of gas supply port 13 in the direction of chamber width, flow velocity distribution of the purge gas in the direction of width can be more uniform.

In vapor-phase process apparatus 1 above, as shown in FIG. 12, a rear end portion (tip end portion 75) of flow-guide plate 70 in the direction of flow of the reaction gas has a wedge-shaped cross-section along the direction of flow of the reaction gas. An angle formed by an angled portion in the cross-section of tip end portion 75 of flow-guide plate 70 above may be 90° or smaller. Here, when the purge gas supplied from the gas introduction portions such as gas supply ports 13 flows along flow-guide plate 70, eddy may be caused around tip end portion 75 of flow-guide plate 70. By shaping tip end portion 75 of flow-guide plate 70 like a wedge as described above, generation of eddy can be suppressed. In addition, by setting the angle formed by the angled portion to 90° or smaller as described above, an effect to suppress generation of eddy can particularly be significant.

Vapor-phase process apparatus 1 above further includes gas supply portion 67 capable of supplying the purge gas into process chamber 4 at a different flow rate from each of one gas introduction portion and another gas introduction portion different from that one gas introduction portion among the plurality of gas introduction portions (gas supply ports 13 or gas supply slits 73). Here, the inventors have found through experiments and the like that generation of deposits on the surface of upper wall 6 is more likely on the downstream side in the direction of flow of the reaction gas when the gas at the same flow rate is supplied from a plurality of gas supply ports 13 or gas supply slits 73. Here, when control is carried out with an identical flow rate of the gas being set for all the plurality of gas supply ports 13 or the like, the flow rate of the gas should considerably be increased as a whole in order to suppress generation of deposits as above. Then, if the flow rate of the gas can independently be controlled for some of the plurality of gas supply ports 13 or gas supply slits 73 as above, such measures that the flow rate of the gas is increased for gas supply port 13 or gas supply slit 73 necessary for suppressing generation of deposits on the downstream side as above (for example, measures for making the flow rate of the gas from gas supply port 13 or gas supply slit 73 located on the downstream side greater than the flow rate of the gas from gas supply port 13 or gas supply slit 73 located on the upstream side) may be taken. Therefore, uniformity of a process or improvement in quality can efficiently be achieved.

In vapor-phase process apparatus 1 above, as shown in FIG. 16, a distance between the other wall portion (bottom wall 5) of process chamber 4 opposed to upper wall 6 where the gas introduction portions are formed and flow-guide plate 70 may be smaller toward the downstream side in the direction of flow of the reaction gas. Here, in the structure where susceptor 2 or the like carrying substrate 8 is arranged on bottom wall 5 side, not only a function to protect the surface of upper wall 6 with the gas layer but also an effect to press the reaction gas toward substrate 8 side by means of the gas layer can more noticeably be obtained. Therefore, such an effect that uniformity of the film deposition process or the like of substrate 8 can further be improved can be expected.

In vapor-deposition apparatus 1 above, as shown in FIG. 20, susceptor 2 holding substrate 8 serving as a process object in process chamber 4 may further be included. Regarding a distance between the other wall portion (bottom wall 5) of process chamber 4 opposed to the wall portion (upper wall 6) where the gas introduction portions (gas supply ports 13) are formed and flow-guide plate 70, the distance at upstream side end portion 81 of susceptor 2 in the direction of flow of the reaction gas may be smaller than the distance at central portion 82 of susceptor 2 in the direction of flow of the reaction gas. Namely, projection portion 80 may be formed in upper wall 6 opposed to upstream side end portion 81 of susceptor 2.

Here, in the vicinity of upstream side end portion 81 of susceptor 2, the height of process chamber 4 is smaller than the height thereof in the vicinity of central portion 82 of susceptor 2. Accordingly, the reaction gas that flowed from the upstream side flows through a region close to susceptor 2 side (namely, the side of substrate 8 which is the process object mounted on susceptor 2) on the side upstream of central portion 82 of susceptor 2. Accordingly, the process of substrate 8 with the reaction gas can relatively be promoted on the side upstream of central portion 82 of susceptor 2. Therefore, such a problem that the process rate is lower on the side upstream of central portion 82 of the susceptor than on the downstream side can be suppressed. For example, an example where a GaN substrate is employed as substrate 8 and an InGaN film is epitaxially grown on substrate 8 is considered. Here, for example, an ammonia gas is supplied from the reaction gas supply portion at a position closest to bottom wall 5 of process chamber 4 (below partition plate 69). Then, trimethylgallium (TMG) and trimethylindium (TMI) that are organic metals and a carrier gas (hydrogen gas) are supplied from the reaction gas supply portion located in the center in a direction of height on the upstream side of process chamber 4 (between partition plate 68 and partition plate 69). Then, a carrier gas (nitrogen gas) is supplied from the reaction gas supply portion uppermost in the direction of height on the upstream side of process chamber 4 (above partition plate 68). Here, based on the structure as shown in FIG. 20, the In composition of InGaN formed on substrate 8 can be improved on the side upstream of central portion 82 of susceptor 2.

The vapor-phase process method according to the present invention includes the steps of arranging substrate 8 which is a process object in process chamber 4 (substrate preparation step (S10)), and processing the process object (substrate 8) by supplying a reaction gas into process chamber 4 (film deposition step (S20)) as shown in FIG. 5. In the processing step (film deposition step (S20)), a gas is supplied at a different flow rate from each of one gas supply port (for example, gas supply port 13 in FIG. 1) and another gas introduction portion different from that one gas supply port 13 (for example, gas supply port 15 in FIG. 1) among a plurality of gas introduction portions (gas supply ports 13 to 17) formed in the wall surface of process chamber 4 along a direction of flow of the reaction gas.

Thus, as compared with an example where the gas is supplied into process chamber 4 at the same flow rate from all gas supply ports 13 to 17, a state of supply of the gas (purge gas) supplied from gas supply ports 13 to 17 into process chamber 4 (more specifically, the state of flow of the purge gas in process chamber 4) can be changed depending on a type or the like of a film deposition process or the like. Therefore, by optimizing the state of supply of the purge gas supplied from gas supply ports 13 to 17 depending on a type of a process, process quality such as uniformity of a process (uniformity of the film deposition rate or film quality) can be improved.

In the vapor-phase process method above, a plurality of gas supply ports 13 to 17 may be formed in the wall surface of process chamber 4 also in a direction of width (the direction of width of process chamber 4) intersecting the direction of flow of the reaction gas as shown in FIGS. 2 to 4. In the processing step (film deposition step (S20)), as in the example using the vapor-phase process apparatus shown in FIG. 4, the gas may be supplied at a different flow rate from each of one gas supply port (for example, gas supply port 14 located under buffer chamber 24a) and an additional gas supply port (for example, the gas supply port located under buffer chamber 24b or buffer chamber 24c) formed at a position different from that of one gas supply port 14 in the direction of width among the plurality of gas supply ports 14 formed in the wall surface in the direction of width.

Here, flow rate distribution or the like of the gas supplied from gas supply ports 13 to 17 is changed also in the direction of width which is the direction intersecting the direction of flow of the reaction gas. Accordingly, the state of supply of the gas supplied from gas supply ports 13 to 17 can more accurately be adjusted.

In the vapor-phase process method above, in the processing step (film deposition step (S20)), substrate 8 serving as the process object may be carried on susceptor 2. As shown in FIG. 8, the plurality of gas introduction portions (gas supply ports 13 to 17) may include one gas introduction portion (gas supply port 14), another gas introduction portion (gas supply port 15), and yet another gas introduction portion (gas supply port 13) formed along the direction of flow of the reaction gas. The first boundary portion (boundary portion 52 in FIG. 8) between gas supply port 14 and gas supply port 15 in the direction of flow of the reaction gas may be arranged to include a position serving as an inflection point (position A in FIG. 9 or the position of segment 56 passing through the center of susceptor 2 in FIG. 8) in the direction of flow of the reaction gas, of a process rate when a vapor-phase process with the reaction gas is performed while the gas is not supplied into process chamber 4 from the plurality of gas introduction portions (gas supply ports 13 to 17). The second boundary portion (boundary portion 51 in FIG. 8) between gas supply port 14 and gas supply port 13 in the direction of flow of the reaction gas may be arranged at a position between the upstream side end portion of susceptor 2 in the direction of flow of the reaction gas and boundary portion 52. In the film deposition step (S20), the gas may be supplied at a different flow rate from each of gas supply port 13, gas supply port 14 and gas supply port 15.

Here, controllability of the rate of the vapor-phase process in the direction of flow of the reaction gas by adjusting the amount of supply of the gas from gas supply ports 13 to 17 can be improved.

In the vapor-phase process method above, the gas supplied from gas supply ports 13 to 17 may include two or more types of gases. Here, a degree of freedom in selecting a gas, for example, in selecting a gas of a type not adversely affecting the process as the gas to be supplied from gas supply ports 13 to 17, can be enhanced.

In the vapor-phase process method above, the gas supplied from gas supply ports 13 to 17 may partially include a gas forming at least a part of the reaction gas. Here, unfavorable influence of a gas supplied from gas supply ports 13 to 17 on the process using the reaction gas (such as a film deposition process) can reliably be suppressed.

In the processing step (film deposition step (S20)) in the vapor-phase process method above, in the direction along the direction of flow of the reaction gas, a flow rate of the gas from the gas supply port located in the downstream (for example, gas supply ports 14 and 15 in FIGS. 1 and 7 and gas supply port 15 in FIG. 8) among the plurality of gas supply ports 13 to 17 may be greater than a flow rate of the gas from the gas supply port located in the upstream (for example, gas supply port 13 in FIGS. 1 and 7 and gas supply ports 14 and 13 in FIG. 8).

Here, in the downstream of the reaction gas flow in process chamber 4, the reaction gas may diffuse to a position distant from substrate 8 serving as the process object. By setting the flow rate of the gas introduced from gas supply ports 14 and 15 to relatively large on the downstream side as described above, such diffusion of the reaction gas can be suppressed. Therefore, the process of substrate 8 can efficiently be performed also in the downstream.

The vapor-phase process method according to the present invention includes the steps of arranging a process object (substrate 8) in process chamber 4 (preparation step (S10) in FIG. 13), and processing the process object (substrate 8) by supplying the reaction gas into process chamber 4 (process step (S30) in FIG. 13). In the process step (S30), a gas supplied to process chamber 4 separately from the reaction gas flows along the surface of the wall portion (upper wall 6) opposed to substrate 8. Flow velocity distribution of the gas in a direction of width which is a direction intersecting a direction of flow of the reaction gas is uniform.

Thus, the gas that flows along the surface of upper wall 6 forms a gas layer on the surface of upper wall 6. Then, this gas layer reduces the amount of the reaction gas reaching the surface of upper wall 6 of process chamber 4. Consequently, in the process step (S30), an amount of deposits originating from the reaction gas on the surface of upper wall 6 can be reduced. Accordingly, the possibility that foreign substances such as deposit pieces formed as a result of peel-off of deposits from the surface of upper wall 6 float in process chamber 4 and adhere to the surface of substrate 8 can be lowered. Therefore, lower process quality due to adhesion of such foreign substances can be suppressed.

In addition, formation of a uniformly flowing gas layer as described above on the surface of upper wall 6 brings about a noticeable effect of increase in flow velocity of the reaction gas in the downstream portion in the direction of flow of the reaction gas. Accordingly, the process rate (film growth rate) in the downstream portion can be increased. Therefore, when a rotary-type susceptor 2 is used, uniformity of a process on substrate 8 (such as a uniformity of thickness or quality of formed epitaxial layer) can be ensured.

In the vapor-phase process method above, the purge gas may be a gas identical to a part of the reaction gas. Here, the gas supplied separately from the reaction gas also reaches substrate 8 in a certain concentration through diffusion. Therefore, influence of the purge gas on quality of the process can be reduced as described above.

In the vapor-phase process method above, in the process step (S30), a process for forming a film containing a group-V element (for example, a process for forming a gallium nitride (GaN) film) on a surface of substrate 8 may be performed as the process above, and the gas is a gas containing a group-V element. Specifically, a gas containing nitrogen such as an ammonia gas may be employed as the gas containing a group-V element. Here, such a problem that concentration of the gas serving as a group-V element supply source in the reaction gas decreases in the downstream and formation rate of a GaN film or the like decreases can be suppressed.

In the vapor-deposition method above, in the step of arranging a process object, substrate 8 serving as the process object may be held on susceptor 2 in process chamber 4. As in vapor-phase process apparatus 1 shown in FIG. 20, regarding a distance between bottom wall 5 formed as the other wall portion opposed to upper wall 6 formed as the wall portion and upper wall 6, the distance at upstream side end portion 81 of susceptor 2 in the direction of flow of the reaction gas may be smaller than the distance at central portion 82 of susceptor 2 in the direction of flow of the reaction gas.

Here, the reaction gas that flowed from the upstream side flows through a region close to susceptor 2 side (that is, the side of substrate 8 which is the process object mounted on susceptor 2) on the side upstream of central portion 82 of susceptor 2. Accordingly, the process with the reaction gas of substrate 8 can relatively be promoted on the side upstream of central portion 82 of susceptor 2. Therefore, such a problem that the process rate is lower on the side upstream of central portion 82 of the susceptor than on the downstream side can be suppressed.

A substrate according to the present invention is a substrate (epitaxial-layer-including substrate 49) manufactured with the vapor-phase process method above as shown in FIG. 6. Thus, as epitaxial-layer-including substrate 49 is subjected to a uniform process, epitaxial-layer-including substrate 49 excellent in quality of the substrate surface layer (such as epitaxial layer 48 formed on the surface of substrate 8) can be obtained.

Example 1

Experiments as follows were conducted in order to explain effects of the present invention.

(Structure of Vapor-Phase Process Apparatus that was Used)

The process chamber of the vapor-phase process apparatus that was employed is formed with a pipe having a rectangular cross-section. The cross-section of the process chamber has a height on an inner side of 12 mm and a width of 170 mm. Stainless steel was used as a material for forming the process chamber. In addition, a disk-like susceptor having an annular two-dimensional shape and a diameter of 150 mm was used as the susceptor. SiC was used as a material for the susceptor. SiC-coated carbon may be used as a material for the susceptor.

A structure in which reaction gas supply ports were arranged in three layers in a direction of height in the process chamber was employed as the structure of the reaction gas supply portion supplying the reaction gas into process chamber 4. Specifically, the ammonia gas was supplied from the reaction gas supply port at a position closest to the bottom wall of process chamber 4. Then, trimethylgallium (TMG) which is a supply source of an organic metal and a carrier gas were supplied from the reaction gas supply port located in the center in the direction of height of the reaction gas supply portion. Then, a carrier gas was supplied from the uppermost reaction gas supply port in the direction of height in the reaction gas supply portion.

Eighteen gas supply ports were formed in the upper wall of the process chamber along the direction of flow of the reaction gas. The gas supply port was in a shape of a slit extending in a direction perpendicular to the direction of flow of the reaction gas (direction of width of the process chamber). The gas supply port had a width of 120 mm, which was equal to the width of the process chamber, and a depth of 1 mm. A pitch between the gas supply ports was set to 15 mm. The position of the gas supply port located on the most upstream side in the direction of flow of the reaction gas was distant from the upstream side end portion of the susceptor by 6 mm toward the downstream.

(Measurement Conditions)

In the experiment, a gallium nitride (GaN) film was epitaxially grown on a gallium nitride substrate. The prepared gallium nitride substrate had a thickness of 300 μm, an annular two-dimensional shape, and a diameter of 50 mm. A heating temperature of the susceptor here was set to 1300° C. Then, a flow rate of ammonia supplied from the lowermost reaction gas supply portion on the bottom wall side was set to 19.5 SLM (Standard Liter per Minute). A flow rate of trimethylgallium was set to 198 μmol/minute. A hydrogen gas was employed as the carrier gas for trimethylgallium. A flow rate of this hydrogen gas was set to 18 SLM. Further, a nitrogen gas ($N_2$) was employed as the carrier gas supplied from the uppermost reaction gas supply portion. A flow rate of this nitrogen gas was set to 4 SLM.

Then, a film deposition rate of gallium nitride on the substrate and a rate of film deposition on the upper wall of the process chamber were measured while varying the flow rate of the purge gas from the gas supply ports. Specifically, under a measurement condition 1, the nitrogen gas at 1.6 SLM was supplied from all eighteen gas supply ports in total. In addition, under a measurement condition 2, among eighteen gas supply ports, the flow rate of the nitrogen gas from five gas supply ports on the upstream side in the direction of flow of the reaction gas was set to 1.6 SLM, and the flow rate of the nitrogen gas from eight gas supply ports on the downstream side was set to 3.2 SLM. Moreover, under a measurement condition 3, the flow rate of the nitrogen gas from five gas supply ports on the upstream side was set to 1.6 SLM, and the flow rate of the nitrogen gas from eight gas supply ports on the downstream side was set to 6.4 SLM. Further, under a measurement condition 4, the nitrogen gas serving as the purge gas was not supplied from the gas supply ports. The film deposition process was performed under these four conditions.

(Measurement Method)

In the film deposition process described above, the deposition rate (growth rate) of the film (GaN film) on the substrate and the rate of deposit formation (deposition rate) on the upper wall of the process chamber were measured. Specifically, data (such as a film thickness) was measured with an X-ray diffraction method, optical interferometry or the like.

(Measurement Results)

Based on results of measurement described above, the growth rate of gallium nitride on the substrate was slowest under condition 4, and the growth rate of gallium nitride was gradually greater in the order of condition 1, condition 2, and condition 3. Specifically, the growth rate of gallium nitride under condition 4 was approximately 1.5 μm/hour (h) at the highest, whereas under condition 3, the highest growth rate was approximately 2.7 μm/hour (h).

On the other hand, the rate of deposition of gallium nitride on the upper wall of the process chamber was highest under condition 4, and it was gradually lower in the order of condition 1, condition 2, and condition 3.

From the foregoing, it was shown that, by supplying the purge gas from the gas supply ports formed in the upper wall or the like of a reaction pipe toward the susceptor as in the present invention, the reaction gas stays for a longer time at a position proximate to the susceptor (that is, the substrate mounted on the susceptor), so that the rate of film deposition on the substrate was improved and unnecessary deposition of gallium nitride on the upper wall of the process chamber could be suppressed.

Example 2

(Structure of Vapor-Phase Process Apparatus that was Used)

The process chamber of the vapor-phase process apparatus that was used had a structure basically the same as that of the process chamber of the vapor-phase process apparatus used in Example 1. In the upper wall of the process chamber, however, sixteen gas supply ports were formed as in vapor-phase process apparatus 1 shown in FIG. 8. This gas supply port had a shape like a slit extending in a direction perpendicular to the direction of flow of the reaction gas (the direction of width of the process chamber), and a size thereof and a pitch between adjacent gas supply ports were set as in the apparatus in Example 1. The position of the gas supply port located on the most upstream side in the direction of flow of the reaction gas is distant from the upstream side end portion of the susceptor by 30 mm toward the upstream side.

The gas supply ports formed in the upper wall of the process chamber were divided into four groups each including four gas supply ports from the upstream side. The gas supply ports belonging to each group are supplied with the gas from the same buffer chamber. Specifically, a group of four gas supply ports 13 from the upstream side shown in FIG. 8 was identified as a first group, a group of next four gas supply ports 14 was identified as a second group, a group of next four gas supply ports 15 was identified as a third group, and a group of four gas supply ports 17 on the most downstream side was identified as a fourth group.

(Measurement Conditions)

In the experiment, an InGaN film was epitaxially grown on a gallium nitride substrate. The prepared gallium nitride substrate had a thickness of 300 μm, an annular two-dimensional shape, and a diameter of 50 mm. A heating temperature of the susceptor here was set to 780° C. Then, a flow rate of ammonia supplied from the lowermost reaction gas supply portion on the bottom wall side was set to 29.5 SLM. A flow rate of trimethylgallium was set to 46 μmol/minute. A flow rate of trimethylindium was set to 37 μmol/minute. A nitrogen gas was employed as the carrier gas for trimethylgallium and trimethylindium. A flow rate of this nitrogen gas was set to 15 SLM. Further, a nitrogen gas ($N_2$) was employed as the carrier gas supplied from the uppermost reaction gas supply portion. A flow rate of this nitrogen gas was set to 34 SLM.

Then, a deposition rate of an InGaN film on the substrate and a rate of film deposition on the upper wall of the process chamber were measured while varying the flow rate of the purge gas from the gas supply ports for each of the first to fourth groups described above. Specifically, under measurement condition 1 (also referred to as condition 1), the nitrogen gas at 20 SLM was supplied from all gas supply ports in the first to fourth groups. In addition, under measurement condition 2 (also referred to as condition 2), the nitrogen gas at 0.1

SLM was supplied from the gas supply ports in the first group, the nitrogen gas at 40 SLM was supplied from individual gas supply ports in the second group, the nitrogen gas at 20 SLM was supplied from individual gas supply ports in the third group, and the nitrogen gas at 20 SLM was supplied from individual gas supply ports in the fourth group. Moreover, under measurement condition 3 (also referred to as condition 3), the nitrogen gas at 0.1 SLM was supplied from the gas supply ports in the first group, the nitrogen gas at 40 SLM was supplied from individual gas supply ports in the second group, the nitrogen gas at 60 SLM was supplied from individual gas supply ports in the third group, and the nitrogen gas at 20 SLM was supplied from individual gas supply ports in the fourth group. The film deposition process was performed under these three conditions.

(Measurement Method)

In the film deposition process described above, the deposition rate (growth rate) of the InGaN film on the substrate was measured. Specifically, data (such as a film thickness) was measured with an X-ray diffraction method, optical interferometry or the like.

(Measurement Results)

Figure 21:
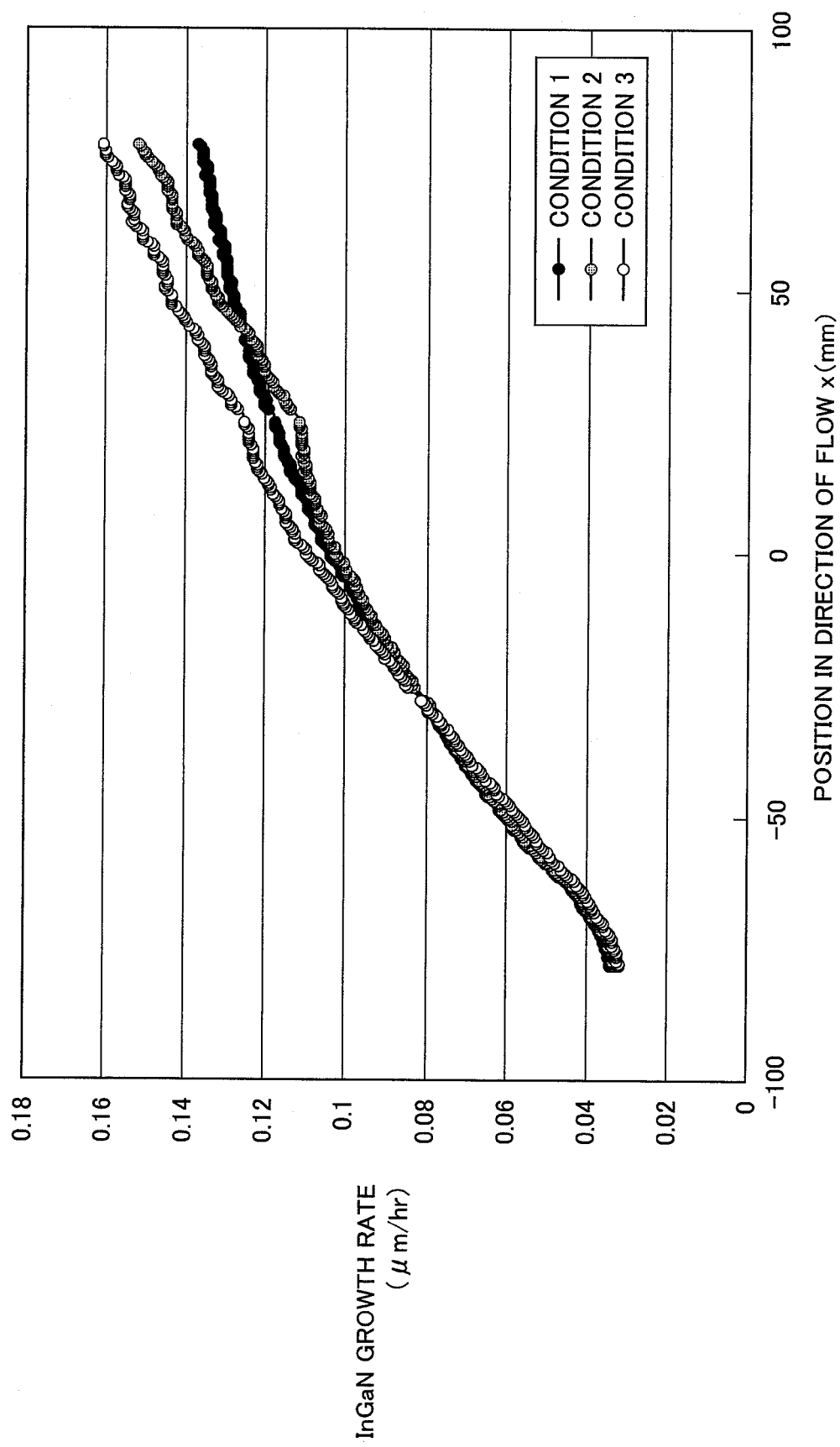
FIG. 21 is a graph showing measurement results in Example 2.

FIG. 21 shows measurement results. The abscissa in FIG. 21 shows a position in the direction of flow (unit: mm). Specifically, zero on the abscissa indicates the central portion of the susceptor. In addition, the left direction on the abscissa (negative side) indicates the upstream side in the direction of flow of the reaction gas, and the right direction on the abscissa (positive side) indicates the downstream side in the direction of flow of the reaction gas. The ordinate in FIG. 21 shows a growth rate of the InGaN film (unit: μm/hr).

Referring to FIG. 21, it can be seen that the film deposition rate in particular on the downstream side was improved under condition 2 as compared with condition 1. In addition, under condition 3, the film deposition rate was improved as compared with condition 1 in the central portion and in the downstream side region in the direction of flow of the reaction gas. Consequently, it can be seen that, under condition 3, the rate of change in the film deposition rate (slope of the graph) is substantially constant from the upstream side toward the downstream side in the direction of flow of the reaction gas. By thus implementing the film deposition conditions under which the rate of change is stable in the direction of flow of the reaction gas, uniformity of the thickness of the film formed on the substrate when the susceptor is turned during film deposition can be improved.

Example 3

Experiments as follows were conducted in order to confirm effects of the present invention.

(As to what was Experimented)

Initially, film deposition experiments were conducted by using the film deposition apparatus shown in FIGS. 10 to 12. Conditions for the apparatus that was used will be described below. A flow path in the film deposition apparatus had a width of approximately 210 mm, and a distance between bottom wall 5 and upper wall 6 was set to approximately 9 mm. The susceptor had a diameter of approximately 205 mm. In film deposition aiming to fabricate a normal device, the susceptor was turned in order to enhance uniformity of the film grown on the substrate. In measuring the growth rate in the direction of flow of the gas and distribution of the film composition, rotation of the susceptor was stopped for film deposition. The substrate had a diameter of approximately 25 mm, and seven substrates were placed on the susceptor. One substrate is placed in the center of the susceptor, and six substrates were arranged around the center of the susceptor, to be symmetrical with respect to a point. The gas was supplied through three routes from the reaction gas supply member, and the gas was supplied in three-layered flow by means of partition plates 68 and 69.

In the experiments, an InGaN film was grown on a GaN substrate. As the gas to be supplied from the reaction gas supply member, a mixture of the ammonia gas at approximately 20 SLM and the nitrogen gas at approximately 0.5 SLM was fed from the lowermost layer among the three layers (a flow path closest to bottom wall 5). In addition, a mixture of TMG at approximately 39 μmol/min, TMI at approximately 145 μmol/min, and nitrogen at approximately 15 SLM was fed from the intermediate layer among the three layers (a flow path surrounded by partition plates 68 and 69). Moreover, nitrogen at approximately 35 SLM was fed from the uppermost layer among the three layers (a flow path closest to upper wall 6). The susceptor was heated with a not-shown heater from below such that the temperature of the susceptor was set to approximately 760° C. During film deposition, rotation of the susceptor was stopped, and the position of the susceptor was held such that three of the substrates placed on the susceptor were aligned on the centerline of the flow path, that is, linearly along the direction of flow of the gas. Film deposition was carried out for approximately one hour.

In addition, the similar experiments were conducted also in the film deposition apparatus in which projection portion 80 shown in FIG. 20 was formed. The film deposition apparatuses having structures under three conditions, in which distance between projection portion 80 and bottom wall 5 was set to 3 mm, 5 mm, and 7 mm respectively, were used. It is noted that the structure other than projection portion 80 in the film deposition apparatus was the same as in the film deposition apparatus shown in FIGS. 10 to 12 described above.

(Measurement Conditions)

A film thickness and an In composition of the formed InGaN layer were measured with the X-ray diffraction method. Specifically, combination of the film thickness and the In composition corresponding to the obtained diffraction pattern was found based on X-ray diffraction simulation. Measurement was performed at a portion corresponding to the position on the centerline of the flow path on the substrate. Distribution of the film thickness and the In composition of the InGaN layer in the direction of flow of the gas was thus found.

(Experiment Results)

Figure 22:
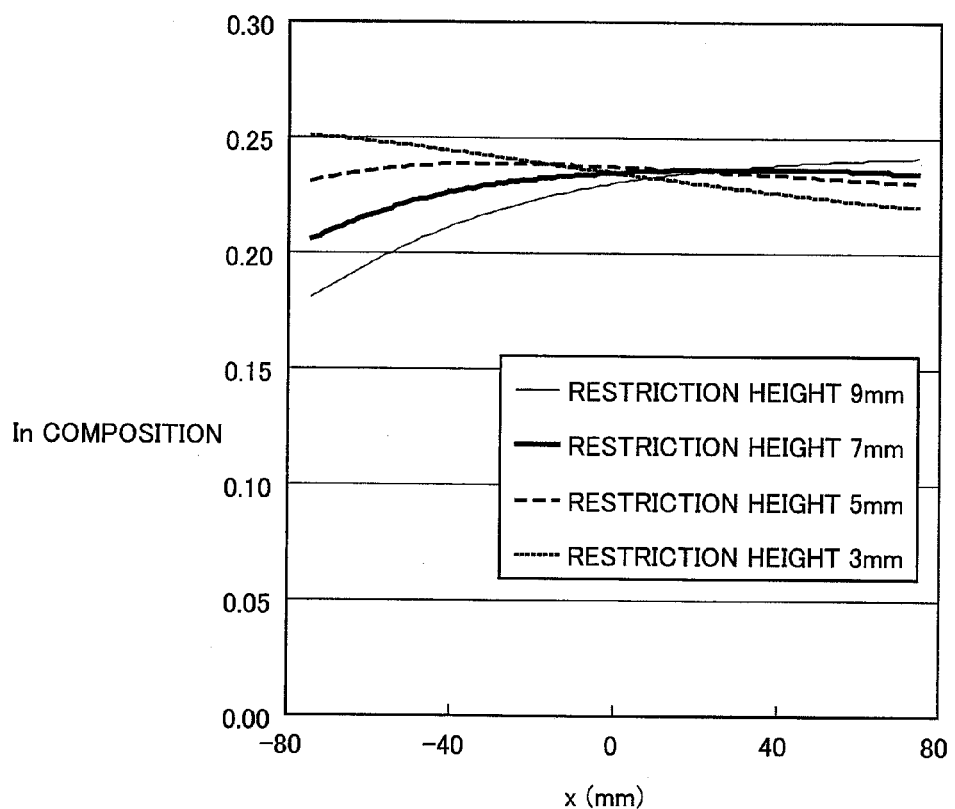
FIG. 22 is a graph showing experiment results.

FIG. 22 shows experiment results. The abscissa in FIG. 22 shows a position in the direction of flow of the reaction gas (unit: mm), assuming the center of the susceptor as zero, the upstream side as negative, and the downstream side as positive. In addition, the ordinate in FIG. 22 shows the In composition of the formed film (InGaN film).

As can be seen in FIG. 22, in an example where projection portion 80 as shown in FIG. 20 was not formed (an example where the film deposition apparatus shown in FIGS. 10 to 12 was used; see data shown as restriction height 9 mm), the In composition on the upstream side is lower than that on the downstream side.

Relation between the In composition of the InGaN film and the position in the direction of flow of the reaction gas when the InGaN film was deposited in the film deposition apparatus in which projection portion 80 shown in FIG. 20 was formed will now be described. As shown in FIG. 20, projection portion 80 has a substantially semicircular cross-sectional shape. Projection portion 80 is formed to extend in the direction intersecting the direction of flow of the reaction gas (perpendicular direction). The restriction height in FIG. 22 means a distance from the bottom wall of process chamber 4 to the peak position of projection portion 80, and corresponds to a height of a gas flow path formed under projection portion 80.

Projection portion 80 had width W of 205 mm. In addition, the position of projection portion 80 is determined such that the central portion of projection portion 80 in the cross-section shown in FIG. 20 is displaced by 15 mm from upstream side end portion 81 of susceptor 2 toward the upstream side in the direction of flow of the reaction gas.

As shown in FIG. 22, it can be seen that, as the restriction height is smaller (that is, as height H of projection portion 80 is greater), the In composition on the upstream side is improved. In other words, by forming projection portion 80, the film deposition condition on the side upstream of the center of susceptor 2 was improved and the InGaN film having a stable In composition could be formed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A vapor-phase process apparatus, comprising:
a process chamber in which a reaction gas flows;
a plurality of gas introduction portions formed in a wall portion of said process chamber along a direction of flow of said reaction gas; and
a flow-guide plate formed to cover said gas introduction portion in said process chamber and guiding a gas supplied from said gas introduction portion into said process chamber such that the gas flows in a direction along the direction of flow of said reaction gas,
said flow-guide plate being formed in the wall portion of said process chamber where said gas introduction portions are formed, to extend in a direction of width intersecting the direction of flow of said reaction gas,
a plurality of the gas introduction portions are formed in the direction of width,
said flow-guide plate covers the plurality of gas introduction portions formed in the direction of width and the flow-guide plate is formed apart from a surface of the wall portion of the process chamber, and
a clearance between the flow-guide plate and the surface of the wall portion constitutes a flow path of the gas supplied from the gas introduction portion.

2. The vapor-phase process apparatus according to claim 1, wherein
said flow-guide plate has a length in said direction of width equal to a length of said process chamber in said direction of width.

3. The vapor-phase process apparatus according to claim 1, wherein
a plurality of said gas introduction portions are formed in said direction of width, and
a size of said flow-guide plate and arrangement of said gas introduction portions are determined to satisfy relation of $L/PH \geq 20$ where L represents a distance from a rear end of said gas introduction portion to a rear end of said flow-guide plate in the direction of flow of said reaction gas, H represents a distance between said wall portion opposed to said flow-guide plate and said flow-guide plate, and P represents a distance between said gas introduction portions adjacent in said direction of width.

4. The vapor-phase process apparatus according to claim 1, wherein
said gas introduction portion includes
a gas introduction hole formed in said wall portion, and
a buffer chamber connected to said gas introduction hole and having a width greater than a width of said gas introduction hole.

5. The vapor-phase process apparatus according to claim 1, wherein
a rear end portion of said flow-guide plate in the direction of flow of said reaction gas has a wedge-shaped cross-section along the direction of flow of said reaction gas, and
an angle formed by an angled portion in the cross-section of said rear end portion is not greater than 90°.

6. The vapor-phase process apparatus according to claim 1, further comprising a gas supply portion capable of supplying the gas into said process chamber at a different flow rate from each of one gas introduction portion and another gas introduction portion different from said one gas introduction portion among said plurality of gas introduction portions.

7. The vapor-phase process apparatus according to claim 1, wherein
a distance between other wall portion opposed to the wall portion of said process chamber where said gas introduction portions are formed and said flow-guide plate is smaller toward downstream in the direction of flow of said reaction gas.

8. The vapor-phase process apparatus according to claim 1, further comprising a susceptor holding a process object in said process chamber, wherein
regarding a distance between other wall portion of said process chamber opposed to the wall portion where said gas introduction portions are formed and said flow-guide plate, said distance at an upstream end of said susceptor in the direction of flow of said reaction gas is smaller than said distance at a central portion of said susceptor in the direction of flow of said reaction gas.

* * * * *